US008743587B2

(12) United States Patent
Takase

(10) Patent No.: US 8,743,587 B2
(45) Date of Patent: Jun. 3, 2014

(54) SEMICONDUCTOR MEMORY DEVICE

(75) Inventor: Satoru Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 13/197,050

(22) Filed: Aug. 3, 2011

(65) Prior Publication Data

US 2012/0033512 A1 Feb. 9, 2012

(30) Foreign Application Priority Data

Aug. 4, 2010 (JP) ................................. 2010-175689

(51) Int. Cl.
*G11C 11/00* (2006.01)
*G11C 11/36* (2006.01)

(52) U.S. Cl.
USPC .......................................... 365/148; 365/175

(58) Field of Classification Search
USPC .................................................. 365/148, 175
See application file for complete search history.

(56) References Cited

U.S. PATENT DOCUMENTS

| 7,623,370 | B2 * | 11/2009 | Toda et al. | 365/148 |
|---|---|---|---|---|
| 7,778,062 | B2 * | 8/2010 | Toda et al. | 365/148 |
| 7,800,935 | B2 * | 9/2010 | Maejima et al. | 365/148 |
| 7,809,890 | B2 | 10/2010 | Takase et al. | |
| 7,885,121 | B2 | 2/2011 | Takase | |
| 8,279,655 | B2 * | 10/2012 | Kanno et al. | 365/148 |
| 2012/0014164 | A1 * | 1/2012 | Kamoshida et al. | |

FOREIGN PATENT DOCUMENTS

JP  2007-109008  4/2007

* cited by examiner

*Primary Examiner* — Trong Phan
(74) *Attorney, Agent, or Firm* — Oblon, Spivak, McClelland, Maier & Neustadt, L.L.P.

(57) ABSTRACT

According to one embodiment, a semiconductor memory device includes first cells, first lines, second lines, a first cell array, and a signal driver. The first cell has in either a first state or a second state. Retention time in the second state is longer than in the first state. The first cell array has the first cells formed in a matrix the individuals. The first cells are electrically connected by the first, second lines. The signal driver drives the first cells. The signal driver causes the first cells to transition to either the first state or the second state by controlling any one of a voltage, a current, and a charge amount applied to the first cells, or a combination of these, and waveforms of the voltage, current, and charge amount and/or the length of transfer time of at least one of the voltage, current, and charge amount.

4 Claims, 17 Drawing Sheets

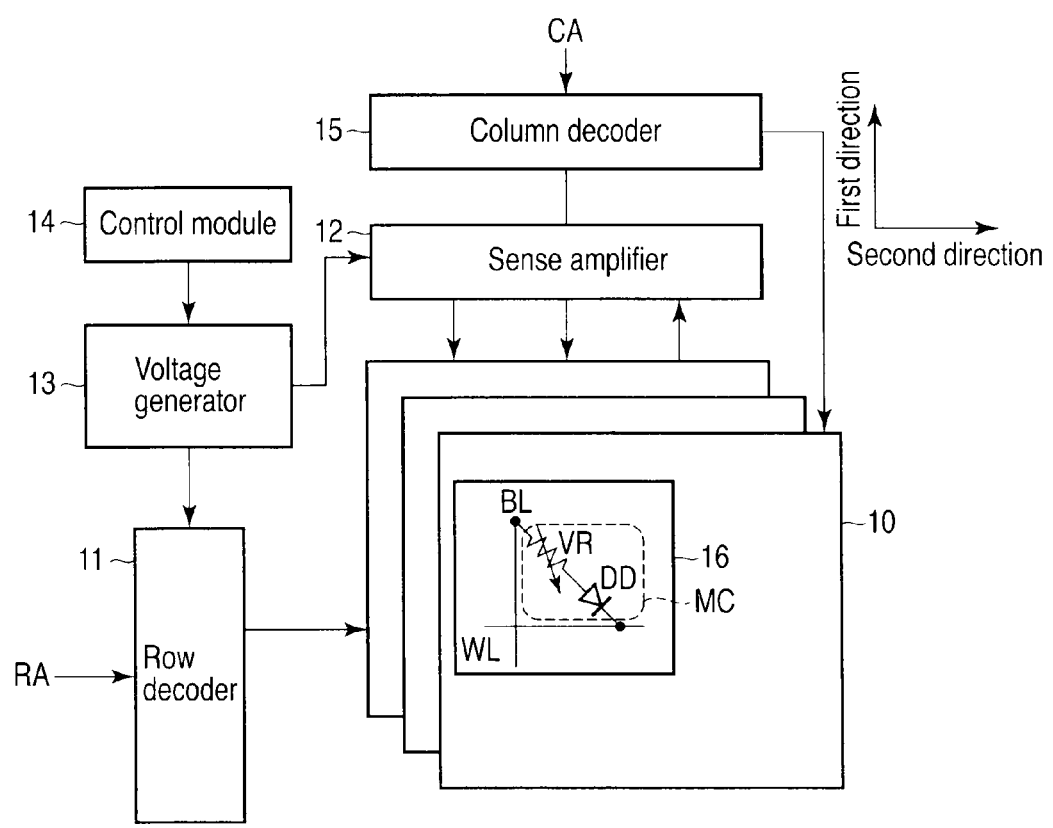
F I G. 1

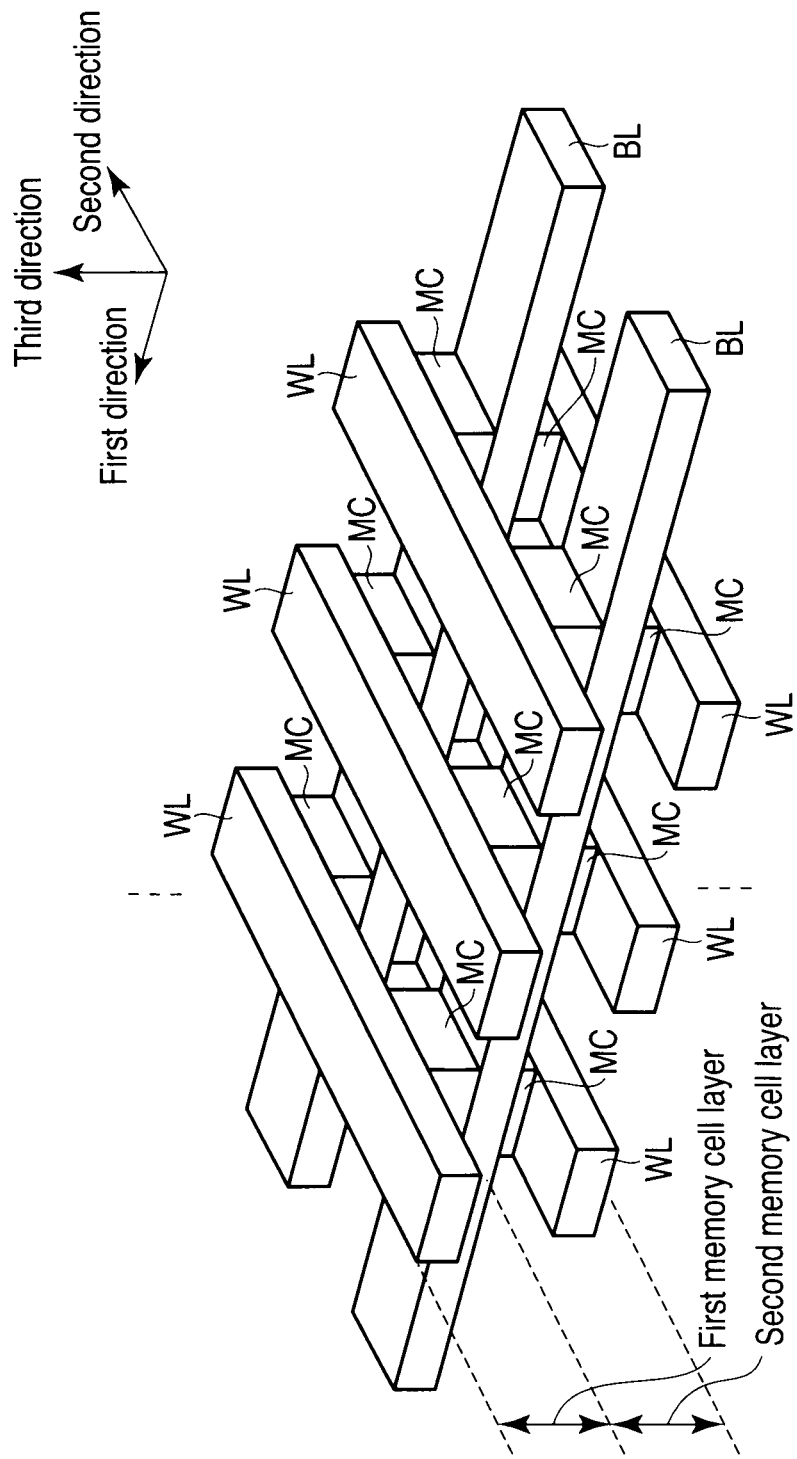
F I G. 3

| Distribution | Number of rewrites possible | Retention time | Volatility | Power consumption | Write condition | Read/write speed |
|---|---|---|---|---|---|---|
| First state (volatility) | Large (e.g. five) | Short | Volatile | High | Weak writing (a few ns) | High (a few ns) |
| Second state (nonvolatility) | Small (e.g. below five) | Long | Nonvolatile | Low | Strong writing (a few μs) | Low (a few μs) |

F I G. 4

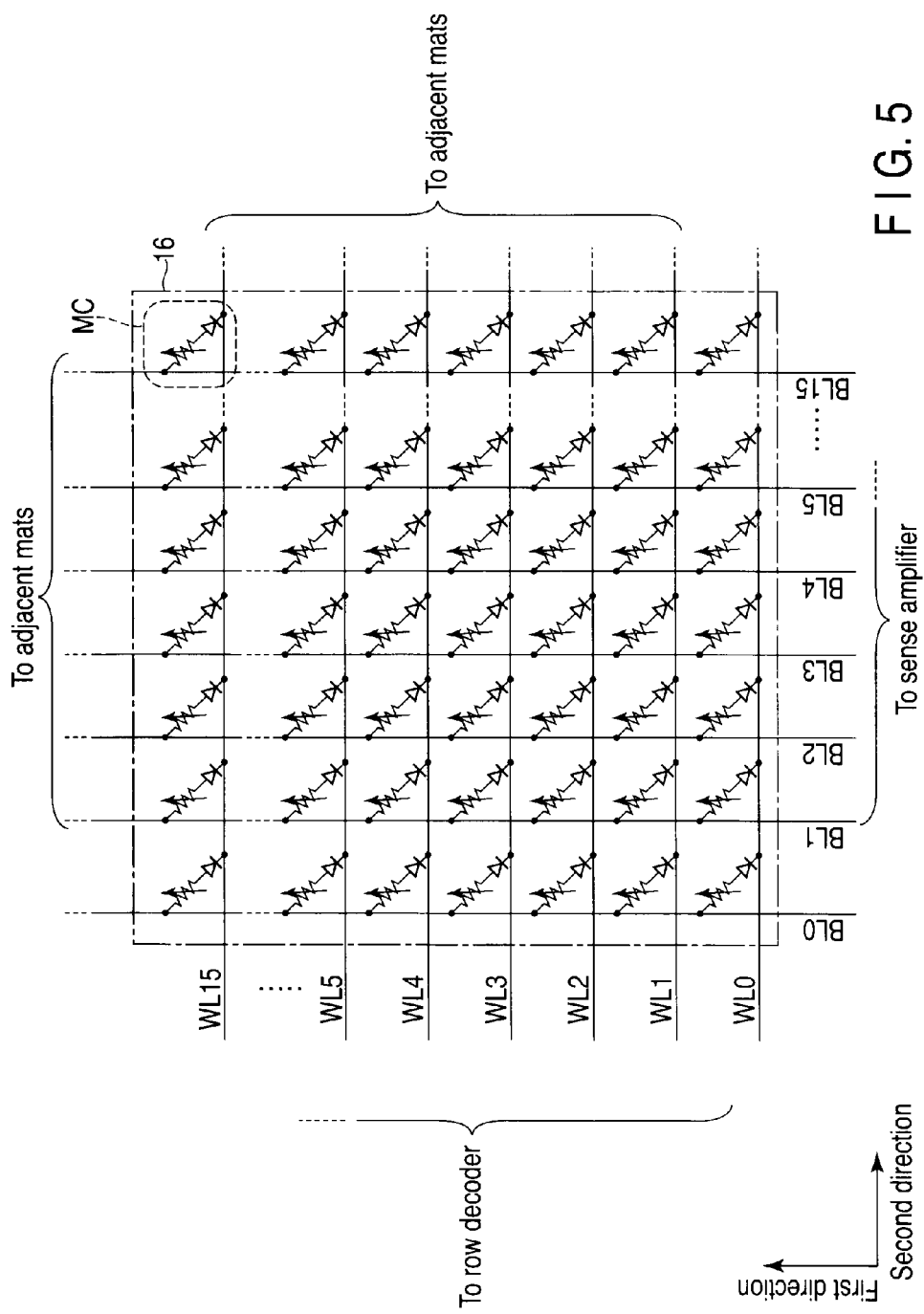
F I G. 5

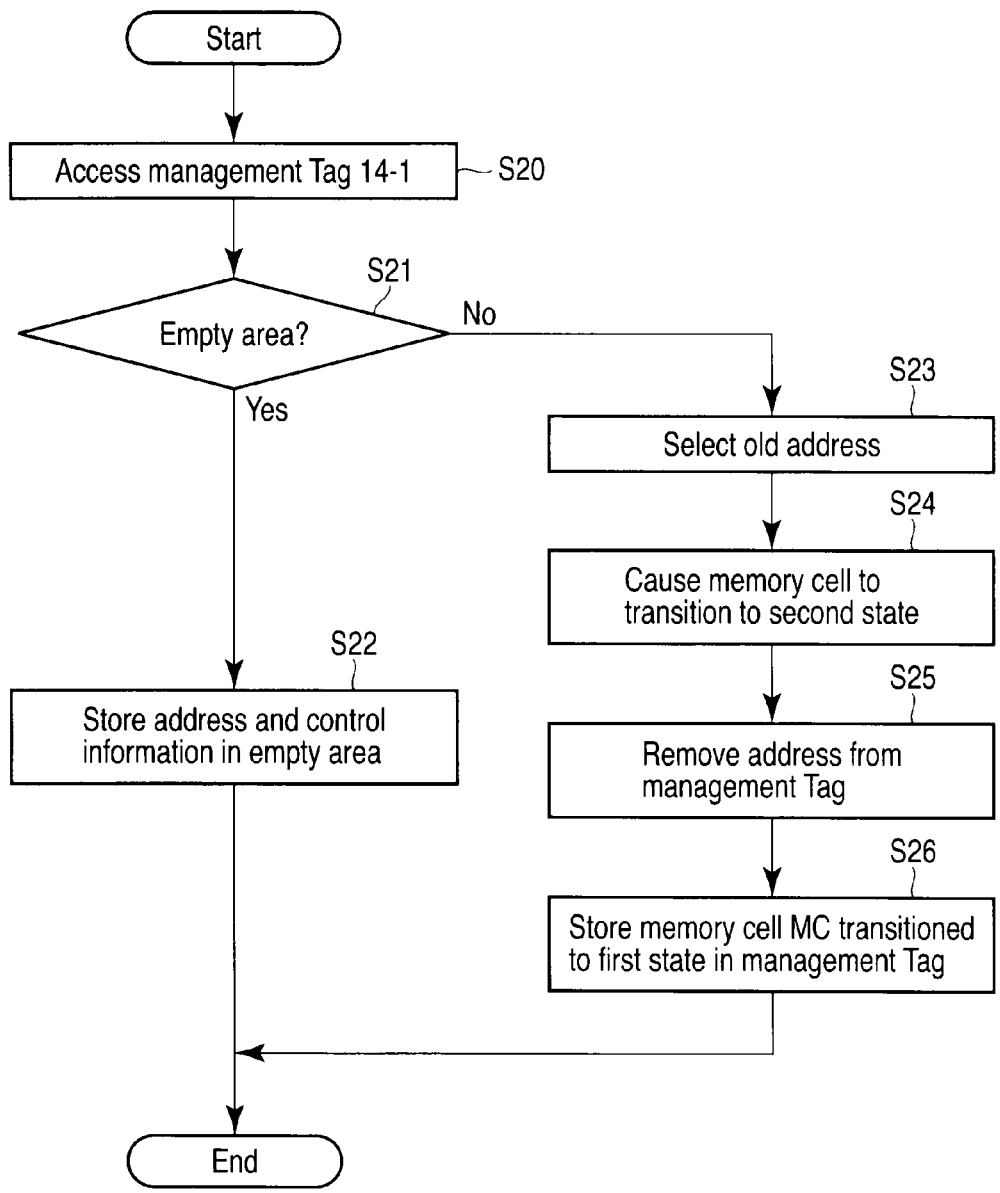
F I G. 11

| Operation | First Least Recent Used 14-2 | Second Least Recent Used 14-3 |
|---|---|---|
| Refresh operation | Unchanged | Moving down in ranking |
| Write operation | Moving down in ranking | Moving down in ranking (condition 1) |
| Read operation | Moving down in ranking | Moving down in ranking (condition 1) |

(Condition 1: when write operation corresponds to refreshing)

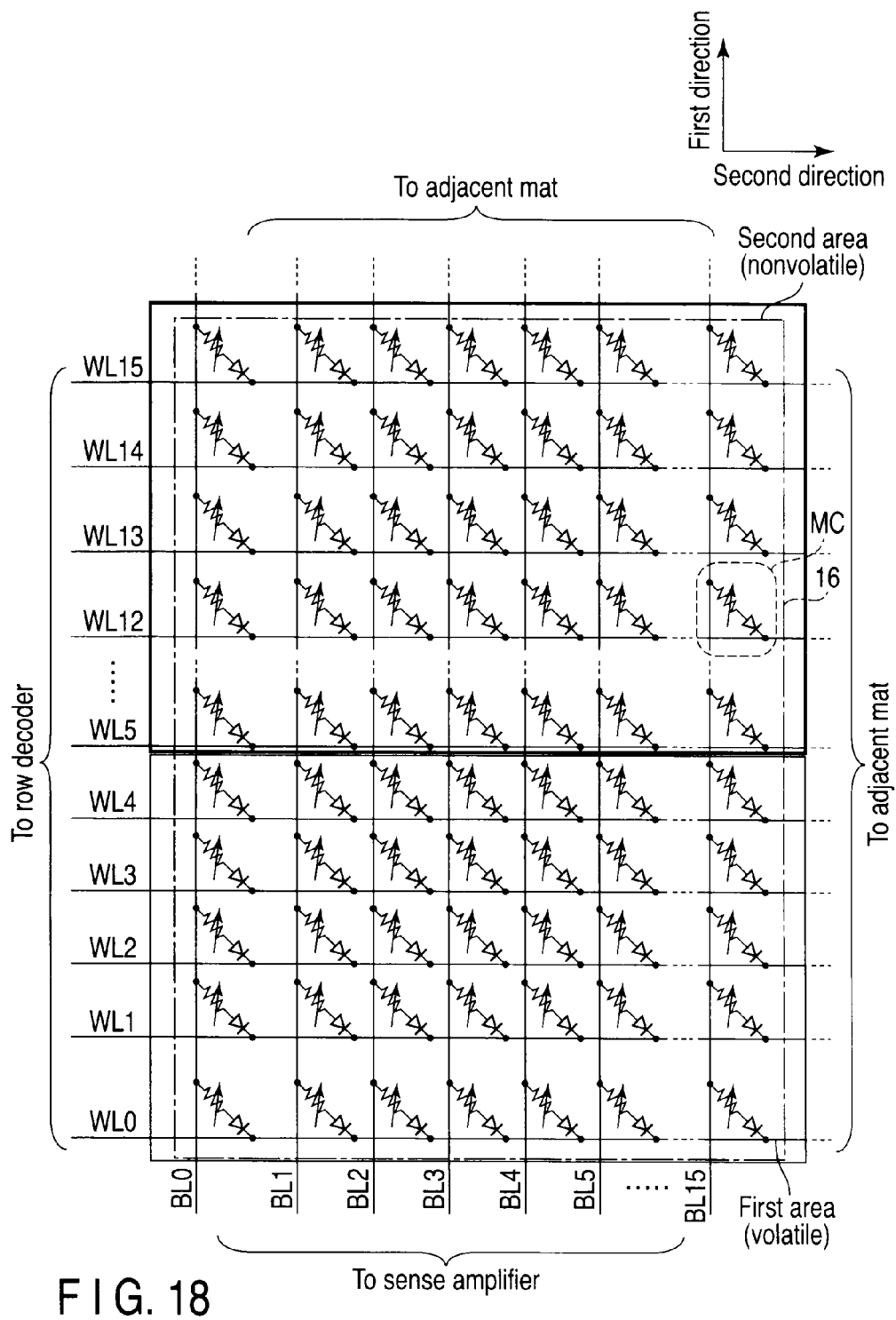
F I G. 18

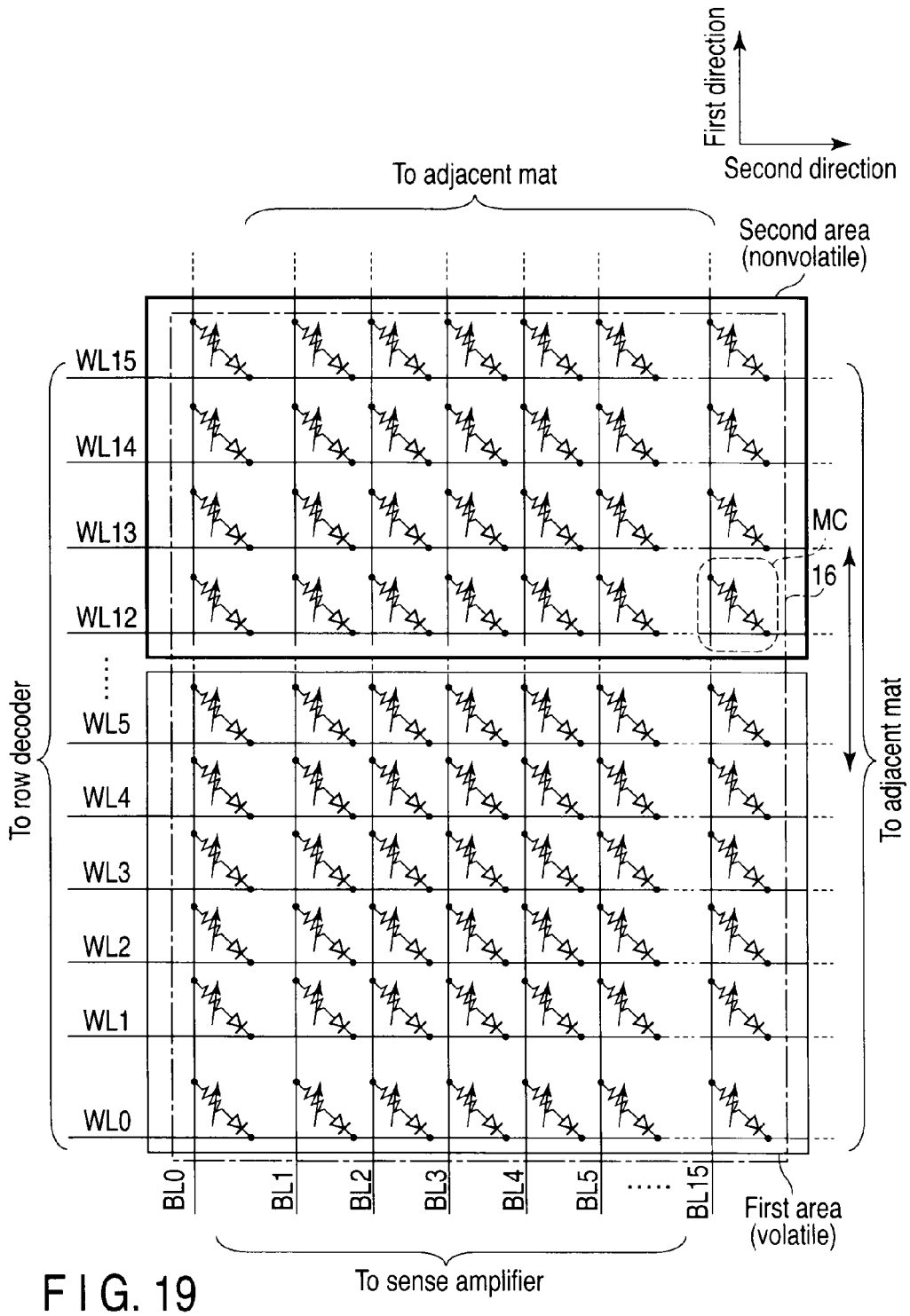
F I G. 19

| | Rewrite time | |
|---|---|---|
| | Short | Long |
| Resistance — High | 00 | 01 |
| Resistance — Low | 10 | 11 |

|  | | Retention time | |
|---|---|---|---|
|  | | Short | Long |
| Resistance | High | 00 | 01 |
| | Low | 10 | 11 |
F I G. 22A
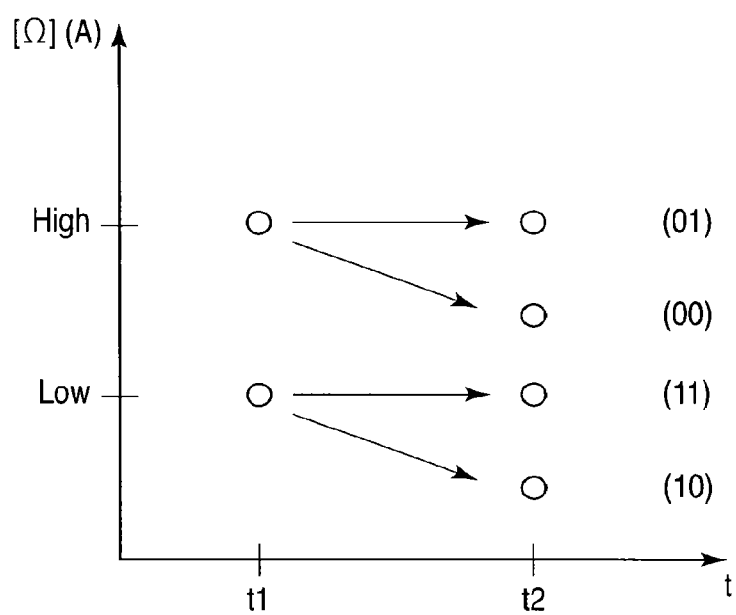
F I G. 22B

SEMICONDUCTOR MEMORY DEVICE

CROSS-REFERENCE TO RELATED APPLICATIONS

This application is based upon and claims the benefit of priority from prior Japanese Patent Application No. 2010-175689, filed Aug. 4, 2010, the entire contents of which are incorporated herein by reference.

FIELD

Embodiments described herein relate generally to a semiconductor memory device capable of controlling the characteristics of a memory cell that has both a volatility characteristic and a nonvolatility characteristic.

BACKGROUND

A semiconductor device that has a volatile memory and a nonvolatile memory mixed in one chip has been developed. The volatile memory is fast in operation speed but requires a refresh operation. In contrast, the nonvolatile memory is slow in operation speed but requires no refresh operation.

In recent years, a semiconductor memory device has been developed which has a nonvolatile memory cell area and a volatile memory cell area provided in a memory cell array making use of a difference in memory cell characteristics. In this semiconductor memory device, a cell in the volatile memory cell area is weak in, for example, data retention, whereas a cell in the nonvolatile memory cell area is strong in, for example, data retention. In the semiconductor memory device, a volatile memory cell area and a nonvolatile memory cell area have been set before shipping. Therefore, it has been difficult to change the areas arbitrarily

BRIEF DESCRIPTION OF THE DRAWINGS

FIG. 1 shows an overall configuration of a semiconductor memory device according to a first embodiment;

FIG. 3 is a perspective view of the memory cell array according to the first embodiment;

FIG. 4 is a table showing the characteristics of a memory cell according to the first embodiment;

FIG. 5 is a circuit diagram of the memory cell array according to the first embodiment;

FIGS. 9 to 12 are flowcharts to explain an operation of the control module according to the first embodiment;

FIG. 13 is a table showing a change in the order of objects to be subjected to a refresh operation according to the first embodiment;

FIG. 18 is a circuit diagram of signal line driver according to the second modification of the first embodiment;

FIG. 19 is a schematic diagram of the memory cell array according to the third modification of the first embodiment;

FIG. 22A is schematic diagram of the multi-value data which the memory cell has when physical quantities are combined according to the third embodiment, and FIG. 22B is schematic diagram of the multi-value data which the memory cell has when physical quantity is combined according to the third embodiment.

DETAILED DESCRIPTION

Figure 2:
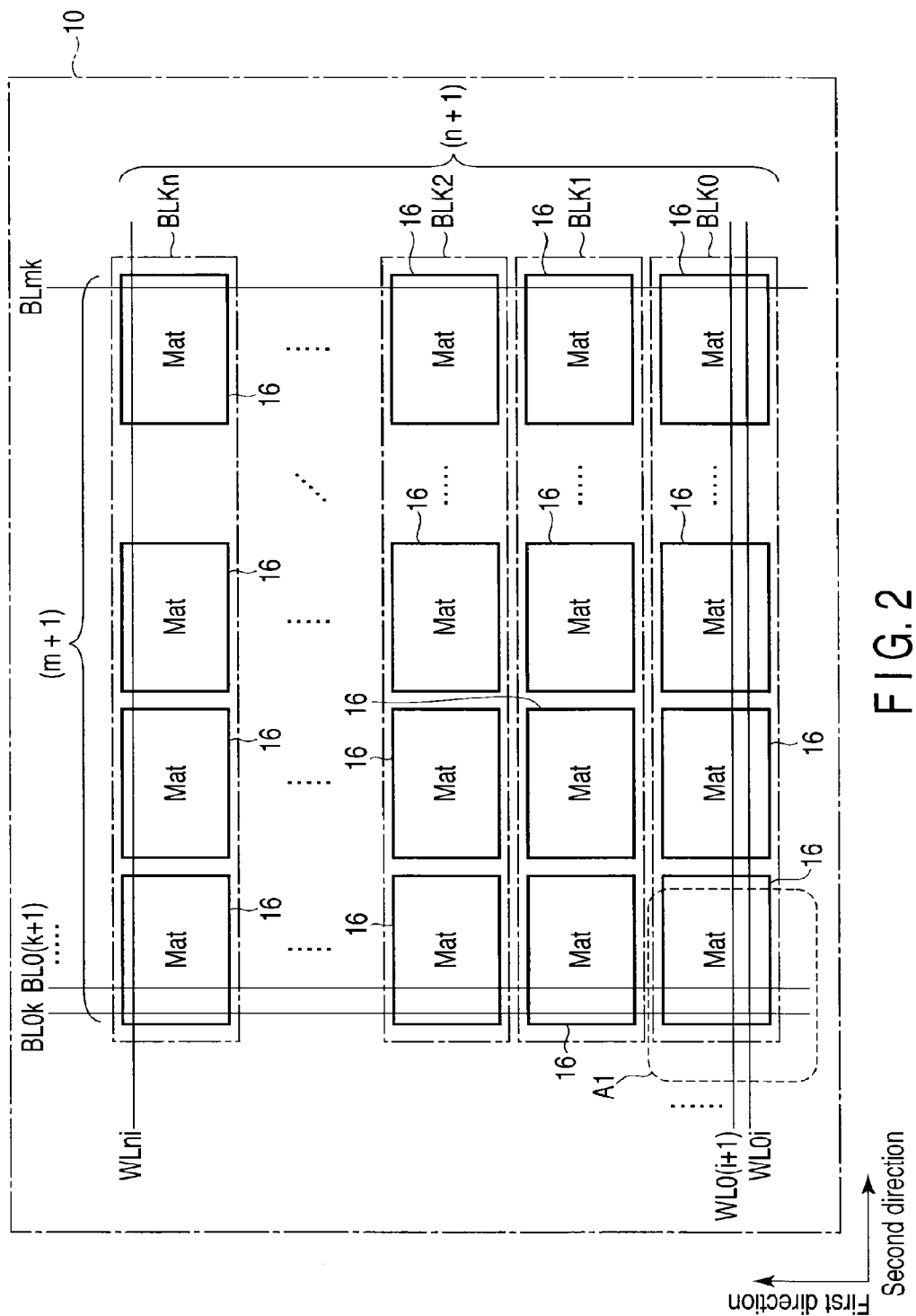
FIG. 2 is a detailed diagram of a memory cell array according to the first embodiment.

Hereinafter, referring to the accompanying drawings, embodiments will be explained. In the explanation below, like parts are shown by corresponding reference symbols throughout all the drawings.

First Embodiment

In general, according to one embodiment, a semiconductor memory device includes first memory cells, first signal lines, second signal lines, a first memory cell array, and a signal line driver. Each of the first memory cells has in either a first state or a second state. The first state or the second state may be distinguished electrically. Data retention time in the second state is longer than in the first state. The first signal lines are formed in a first direction. The second signal lines are formed in a second direction perpendicular to the first direction. The first memory cell array has the first memory cells formed in a matrix the individuals. The first memory cells are provided near first areas at the intersections of the first signal lines and the second signal lines. The first memory cells are electrically connected by the first signal lines and the second signal lines. The signal line driver drives the first memory cells via the first and second signal lines. The signal line driver causes the first memory cells to transition to either the first state or the second state by controlling any one of a voltage, a current, and a charge amount applied to the first memory cells, or a combination of these, and waveforms of the voltage, current, and charge amount and/or the length of transfer time of at least one of the voltage, current, and charge amount.

That is, in a semiconductor memory device according to a first embodiment, a method of applying a voltage to a memory cell MC is changed. Specifically, the magnitude of an applied voltage, the application time of the voltage, the rise time (speed of rise transition) of the voltage, or the like is changed. By doing this, the characteristic of the same memory cell MC is caused to transition to either a volatile or a nonvolatile characteristic.

To write and read data rapidly, a memory cell MC whose data traffic in a write or a read operation has increased is caused to transition to a volatile memory.

In contrast, a memory cell MC which has not been accessed for a long time, for example, because its data traffic has decreased is caused to transition to a nonvolatile memory.

An overall configuration of the semiconductor memory device according to the first embodiment will be explained with reference to FIG. 1. In the first embodiment, a case where a Resistance Random Access Memory (ReRAM) is used as a memory cell MC will be explained.

1. Overall Configuration

FIG. 1 is a block diagram of a semiconductor memory device using an ReRAM as a memory cell MC in the first embodiment. As shown in FIG. 1, the semiconductor memory device of the first embodiment comprises a memory cell array 10, a row decoder 11, a sense amplifier 12, a voltage generator 13, a control module 14, and a column decoder 15.

The memory cell array 10 comprises a plurality of bit lines BLs provided in a first direction, a plurality of word lines WLs provided in a second direction perpendicular to the first direction, and a plurality of memory cells MCs provided at the intersections of bit lines BLs and word lines WLs. A cluster of memory cells MCs constitutes a unit called a mat (MAT) 16.

Each of the memory cells MCs includes a rectification element (diode) DD and a variable-resistance element VR. The cathode of the diode DD is connected to a word line WL and the anode of the diode DD is connected, via a variable-resistance element VR, to a bit line BL. The variable-resistance element VR has, for example, a structure where a recording layer and a protective layer are stacked one on top of the other on the diode DD.

In the memory cell array 10, a plurality of memory cells MCs arranged in the same row are connected to the same word line WL. A plurality of memory cells MCs in the same column are connected to the same bit line BL. A plurality of sets of word lines WLs, bit lines BLs, and memory cells MCs are provided in a third direction perpendicular to both the first and second directions (or in a direction perpendicular to the surface of the semiconductor substrate). That is, the memory cell array 10 has such a structure as has memory cells MCs stacked three-dimensionally. Hereinafter, each layer of memory cells in this three-dimensional structure is sometimes called a memory cell layer.

1-1. Configuration of Memory Cell Array 10

Next, a detailed configuration of the memory cell array 10 will be explained with reference to FIG. 2. FIG. 2 is a block diagram of the memory cell array 10, showing only one memory cell layer.

As shown in FIG. 2, the memory cell array 10 of the first embodiment comprises (m+1)×(n+1) mats 16 arranged in a matrix. Each of m and n is a natural number not less than 1. As described above, each of the mats 16 includes a plurality of memory cells MCs arranged in a matrix. For example, one mat 16 includes, for example, 16 word lines WLs and 16 bit lines BLs. That is, one mat 16 includes (16×16) memory cells MCs. The memory cell array 10 further includes 16×(m+1) bit lines BLs and 16×(n+1) word lines WLs. A plurality of mats 16 in the same row (that is, mats 16 sharing a word line WL) constitute a block BLK. Therefore, the memory cell array 10 is composed of blocks BLK0 to BLKn. Hereinafter, when there is no need to distinguish between blocks BLK0 to BLKn, they will simply be referred to as blocks BLKs.

In the first embodiment, although a memory cell layer includes a plurality of mats 16 is explained, the number of mats 16 may be one. The number of memory cells MCs included in a mat 16 is not limited to (16×16). In addition, the row decoder 11 and sense amplifier 12 may be provided for each mat 16 or may be shared by a plurality of mats 16. Hereinafter, an explanation will be given, taking the latter case as an example.

1-2. Perspective View of Memory Cell Array 10

FIG. 3 is a perspective view of a part of the memory cell array 10, showing a three-dimensional configuration of the memory cell array 10. As shown in FIG. 3, a plurality of memory cell arrays 10 (a first memory cell layer, a second memory cell layer, . . . ) are stacked one on top of another in a direction perpendicular to the surface of the semiconductor substrate (or in a third direction). While in the example of FIG. 3, word line WL/memory cell MC/bit line BL/memory cell MC/word line/ . . . are formed in that order, sets of word line WL/memory cell MC/bit line BL may be stacked one top of another via interlayer insulating films.

1-3. Electric Characteristics of Memory Cell MC

Next, the characteristics of the memory cell MC will be explained. A memory cell MC holds 1-bit data, 0 or 1, according to the resistance of a variable-resistance element VR. The variable-resistance element VR can take a low-resistance state where its resistance is, for example, in the range of 1 to 10 kΩ or a high-resistance state where its resistance is, for example, in the range of 100 kΩ to 1 MΩ.

The high-resistance state is a state where binary 0 is held and where data has been written (at a program level). The low-resistance state is a state where binary 1 is held and where data has been erased (at an erase level).

Furthermore, in the high-resistance state where binary 0 is held, the memory cell MC can transition to either a first state (volatility) where the retention time of binary 0 is short or a second state (nonvolatility) where the retention time is longer than in the first state. That is, a memory cell MC in the first state has the property of requiring a refresh operation as, for example, a DRAM does. A memory cell MC in the second state has the property of holding data for a long time even if the main power supply is off as, for example, a flash memory does. Each of the first and second states can be controlled by the pulse width of a voltage applied to the variable-resistance element VR, the magnitude of the applied voltage, the rise time of the voltage, or the like. In addition, the low-resistance state may be a state where binary 0 is held and the high-resistance state may be a state where binary 1 is held.

Specifically, the memory cell MC transitions to the first state by narrowing the pulse width of a voltage applied to the variable-resistance element VR, reducing the magnitude of the applied voltage, and decreasing the rise time of the voltage (or reducing the rise angle) in comparison with when the memory cell MC is caused to transition to the second state. This will be explained later. In addition, to cause the memory cell MC to transition to the first state, use is made of at least one of decreasing the pulse width of the voltage, decreasing the magnitude of the voltage, and decreasing the rise time in causing the memory cell MC to transit to the second state.

The characteristics of the memory cell MC when voltage control is performed will be explained with reference to FIG. 4. FIG. 4 is a table showing the characteristics of the memory cell MC that has transitioned to (Distribution) the first state or second state in the high-resistance state.

As shown in FIG. 4, the number of times the memory cell MC can be rewritten (Number of Rewrites Possible) is greater (Large) in the first state presenting volatility than in the second state (Small).

The retention characteristic (in FIG. 4, written as retention time) in the second state is superior to that in the first state.

That is, the memory cell MC transitioned to the second state is superior in data retention to that transitioned to the first state.

Next, volatility will be explained. The volatility is associated with the retention characteristic above. That is, the retention characteristic in the second state is superior to that in the first state. Therefore, the memory cell MC transitioned to the first state presents more volatility than the memory cell MC transitioned to the second state. In addition, the memory cell MC transitioned to the second state presents more nonvolatility than the memory cell MC transitioned to the first state.

Next, power consumption (or electric power of the entire chip required to hold data, which may be referred to as holding current) will be explained. In the case of the first state (High power consumption), or the volatile memory cell MC, the data retention time is shorter than that of the nonvolatile memory cell MC. Therefore, a refresh operation has to be performed as many times as needed to cause the volatile memory cell MC to hold data. That is, a specific voltage or current is applied or supplied to the memory cell MC, resulting in an increase in the electric power consumed by the whole semiconductor memory device.

In contrast, in the case of the second state (Low power consumption), or the nonvolatile memory cell MC, a refresh operation is performed less frequently than in the volatile memory cell MC. That is, although the nonvolatile memory cell MC may be subjected to a refresh operation, the number of refresh operations is smaller than in the volatile memory cell MC. Accordingly, the power consumption is minimized.

A writing method (Write Condition) will be explained. As described above, when a voltage shorter in applying time and/or lower than the voltage for causing the memory cell MC to transition to the second state is applied (Weak writing), the memory cell MC transitions from the second state to the first state, that is, to a volatile memory cell MC.

In contrast, when a voltage longer in applying time and/or higher than the voltage for causing the memory cell MC to transition to the first state is applied (Strong writing), the memory cell MC transitions from the first state to the second state, that is, to a nonvolatile memory cell MC.

In other words, when a high-impact voltage or current is supplied to the memory cell MC, the memory cell MC transitions to a nonvolatile memory cell MC, whereas a low-impact voltage or current is supplied to the memory cell MC, the memory cell MC transitions to a volatile memory cell MC.

Next, the operation speed Read/write speed) will be explained. As described above, when the data write time is shorter and the applied voltage is lower than in the case of the voltage for causing the memory cell MC to transition from the first state to the second state, the characteristic of the memory cell MC transitions from the second state to the first state, that is, to a volatile memory cell MC. Therefore, the time required to access a volatile memory cell MC become shorter, improving the operation speed of the entire circuit.

In contrast, when the memory cell MC is in the second state, that is, a nonvolatile memory cell MC, the data write time is longer and the applied voltage is higher. Therefore, the time required to access a volatile memory cell becomes longer, decreasing the operation speed of the entire circuit.

Although not shown in FIG. 4, the memory cell MC can be caused to transition to the first state by raising the voltage more slowly (increasing the rise time) than when the memory cell MC is caused to transition to the second state.

1-4. Circuit Diagram of Memory Cell MC

FIG. 5 is a circuit diagram of the memory cell array 10, particularly showing an area corresponding to area A1 of FIG. 2 of a memory cell layer.

As shown in FIG. 5, in the memory cell array 10, a plurality of bit lines BLs and a plurality of word lines WLs are formed so as to pass through a plurality of mats 16.

A mat 16 includes 16 bit lines BLs and 16 word lines WLs as described above. There are (m+1)×(n+1) mats 16 in the memory cell array 10. In a block BLKi, word line WL(16i) to WL(16i+15) are formed. In each of a plurality of mats 16 included in a block BLK, bit lines BL(16j) to BL(16j+15) are formed. Here, i=0 to n, j=0 to m.

At each of the intersections of bit lines BLs and word lines WLs, a memory cell MC has been formed.

The word lines WLs are connected to the row decoder 11. Bit lines BL0 to BLn are connected to sense amplifiers 12.

1-5. Peripheral Circuitry

The row decoder 11 will be explained with reference to FIG. 1. The row decoder 11 decodes row address RA supplied from a host device in writing, reading, or erasing data. The row decoder 11 comprises a signal line driver. The row decoder 11 selects any one of the word lines WLs according to the result of decoding row address RA and supplies suitable voltages to the selected word line WL and unselected word lines WLs.

Specifically, the row decoder 11 applies voltage $V_{L\_WL}$ to the selected word line WL and voltage $V_{H\_WL}$ (>voltage $V_{L\_WL}$) to the unselected word lines WLs. If a reverse bias is applied to the rectification element DD, the row decoder 11 may apply voltage $V_{L\_WL}$ to the unselected word lines WLs. The magnitude relationship between voltage $V_{H\_WL}$ and voltage $V_{L\_WL}$ may be voltage $V_{H\_WL}$<voltage $V_{L\_WL}$ or voltage $V_{H\_WL}$=voltage $V_{L\_WL}$. The magnitude relationship changes for the purpose of minimizing the sum of currents flowing in the memory cell array 10 or increasing an operation margin. Here, an operation margin will be explained.

To cause the memory cell MC to operate properly, a voltage applied and a current supplied to the memory cell MC are allowed to have a certain range (or margin). In addition, to cause the memory cell MC to operate properly even in the presence of noise, the voltage applying range or current supplying range are determined with a certain latitude. This latitude is called an operation margin. Generally, even if an attempt is made to increase a margin, focusing on a certain parameter (such as a voltage or a current), the parameter, in most cases, is traded off against another parameter. The setting of each of the voltage and current has an optimum point. The work of setting a plurality of voltage optimum points by changing the magnitude relationships of voltage as described above has been defined as increasing an operation margin. Hereinafter, an explanation will be given on the assumption that voltage $V_{H\_WL}$>voltage $V_{L\_WL}$.

The column decoder 15 decodes column address CA supplied from a host device (not shown) in writing, reading, or erasing data. Then, the column decoder 15 selects any one of the bit lines BLs according to the result of decoding column address CA.

The sense amplifier 12 is connected electrically to a bit line BL. The sense amplifier 12 includes a signal line driver 12-1, see FIG. 6.

The sense amplifier 12 supplies suitable voltages to the selected bit line BL selected by the column decoder 15 and the unselected bit lines BLs in reading, writing, or erasing data. Specifically, the sense amplifier 12 applies voltage $V_{H\_WL}$ to the selected bit line BL and voltage $V_{L\_WL}$ (<voltage $V_{H\_WL}$) to the unselected word lines WLs. If a reverse bias is applied to the rectification element DD, the sense amplifier 12 may apply voltage $V_{H\_BL}$ to the unselected bit lines BLs. When reading data, the sense amplifier 12 senses and amplifies data read onto the bit line BL.

The sense amplifier 12, row decoder 11, and column decoder 15 may be provided for each memory cell layer or for each mat 12. Alternatively, they may be shared by memory cell layers. When the sense amplifier 12, row decoder 11, and column decoder 15 are shared by memory cell layers, the allocation of addresses of memory cells MCs is changed or modified suitably. By doing this, the size of the peripheral circuitry, including the sense amplifier 12, row decoder 11, and column decoder 15, can be suppressed even when a plurality of memory cell layers are stacked one on top of another.

The voltage generator 13 generates the voltage $V_{L\_BL}$, voltage $V_{H\_BL}$, voltage $V_{L\_WL}$, and voltage $V_{H\_WL}$ under the control of the control module 14. The voltage generator 13 supplies voltage $V_{L\_WL}$ and voltage $V_{H\_WL}$ to a signal line driver in row decoder 11 and voltage $V_{L\_BL}$ and voltage $V_{H\_BL}$ to a signal line driver 12-1 in sense amplifier 12.

Figure 6:
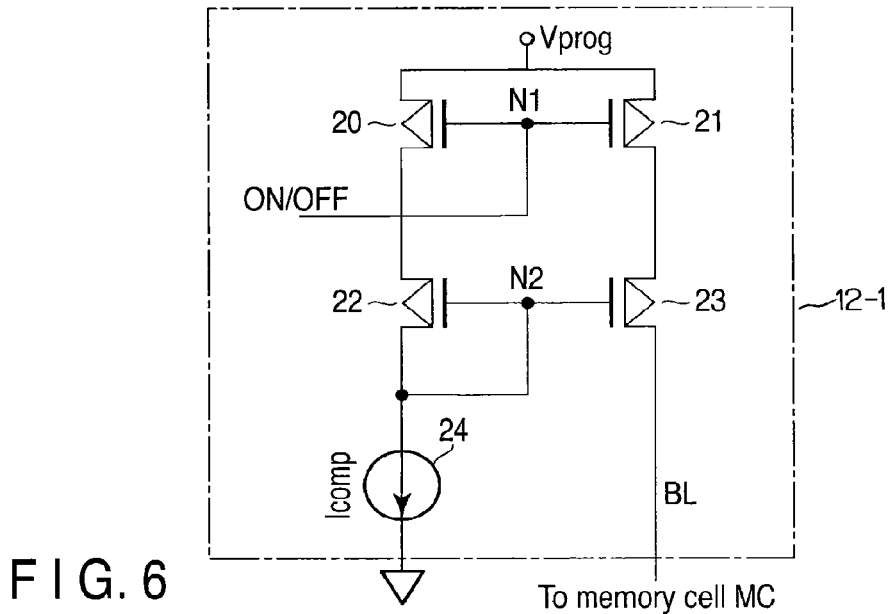
FIG. 6 is a circuit diagram of a signal line driver with a current control circuit according to the first embodiment.

A configuration of the signal line driver 12-1 provided in the sense amplifier 12 will be explained with reference to FIG. 6. The signal line driver 12-1 includes p-channel MOS transistors 20 to 23 and a current source 24. Voltage Vprog (voltage $V_{L\_BL}$ or voltage $V_{H\_BL}$) is supplied to the source end of MOS transistor 20. The drain end of MOS transistor 20 is connected to the source end of MOS transistor 22. The gate of MOS transistor 20 is connected to node N1. A signal to turn on or off MOS transistor 20 is supplied from the control module 14 to node N1.

The source end of MOS transistor 21 is connected to the source end of MOS transistor 20. The drain end of MOS transistor 21 is connected to the source end of MOS transistor 23. The gate of MOS transistor 21 is connected to the gate of MOS transistor 20 at node N1. That is, when the potential at node N1 is low, each of MOS transistors 20, 21 is turned on, causing current corresponding to voltage Vprog to flow to the drain ends of MOS transistors 20, 21.

The source end of MOS transistor 22 is connected to the drain end of MOS transistor 20. The drain end of MOS transistor 22 is connected to the current source 24. The gate of MOS transistor 22 is connected to node N2.

The source end of MOS transistor 23 is connected to the drain end of MOS transistor 21. The drain end of MOS transistor 23 is connected to a bit line BL. The gate of MOS transistor 23 is connected to the gate of MOS transistor 22. Node N2 is connected to the drain end of MOS transistor 22. That is, the potential at the gate of and that at the drain end of MOS transistor 22 are the same. When the potentials at node N1 and node N2 are made low and MOS transistors 20, 22 are turned on, current corresponding to voltage Vprog flows in the drain end of MOS transistor 22. When the potential at node N2 rises and reaches a certain potential, MOS transistor 22 is turned off. Then, since no current flows in the drain end of MOS transistor 22, the potential at node N2 drops to a certain value, at which MOS transistor 22 is turned on again. That is, MOS transistor 22 supplies a constant current (or a constant voltage) to the current source 24, while being turned on and off repeatedly. This causes the current source 24 to output a constant current Icomp.

MOS transistor 20 and MOS transistor 21 constitute a mirror circuit. MOS transistor 22 and MOS transistor 23 constitute a mirror circuit. That is, current flowing in the drain end of MOS transistor 23 makes current Icomp flowing in the constant current source 24. Signal line driver 12-1 changes the magnitude of a voltage or the like, while keeping constant current Icomp at a specific level.

Figure 7A:
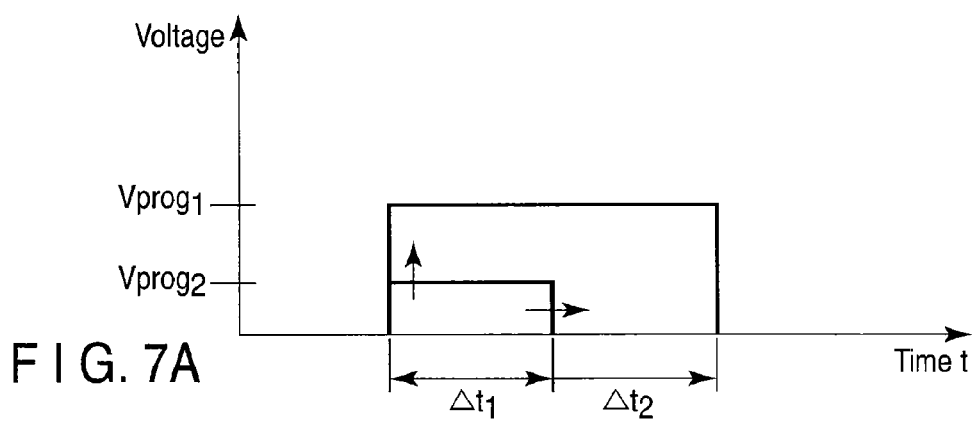
FIG. 7 is a conceptual diagram of a voltage applied to a variable-resistance element according to the first embodiment, FIG. 7A being a conceptual diagram showing an applied voltage and the applying time of the applied voltage, and FIG. 7B being a conceptual diagram showing a degree of a rise in the voltage.

Next, a voltage applied to the variable-resistance element VR by the signal line driver 12-1 will be explained with reference to FIGS. 7A and 7B. FIG. 7A is a graph showing a voltage applied to the variable-resistance element VR. FIG. 7A is a conceptual diagram showing an applied voltage and its applying time. As shown in FIG. 7A, there are two cases for signal line driver 12-1: in one case, the applying time of signal line driver 12-1 is Δt1 and signal line driver 12-1 applies either voltage Vprog2 or voltage Vprog1 (>voltage Vprog2) to the variable-resistance element VR; and in the other case, the applying time of signal line driver 12-1 is Δt2 (>Δt1) and signal line driver 12-1 applies either voltage Vprog2 or voltage Vprog1 to the variable-resistance element VR.

Here, each of voltage Vprog1 and voltage Vprog2 is the potential difference between voltage $V_{H\_BL}$ and voltage $V_{L\_WL}$ and is a voltage applied to the variable-resistance element VR.

If voltage $V_{H\_BL}$ and voltage $V_{H\_WL}$ satisfy the expression voltage $V_{H\_BL}$>voltage $V_{H\_WL}$, each of voltage Vprog1 and voltage Vprog2 may be the potential difference between $V_{H\_BL}$ and voltage $V_{H\_WL}$, provided that voltage Vprog1 and voltage Vprog2 differ.

As described above, the longer the applying time and the higher the applied voltage, the more easily the memory cell MC transitions to the second state (in FIG. 7A, in the direction shown by an outward arrow). Conversely, the shorter the applying time and the lower the applied voltage, the more easily, the memory cell MC transitions to the first state. That is, in FIG. 7, the more the direction of the arrow faces outward, the more easily the memory cell MC transitions to a nonvolatile memory cell MC.

In addition, the steeper the rising angle of the applied voltage, the more easily the memory cell MC transitions to the second state. The more obtuse the rising angle, the more easily the memory cell MC transitions to the first state. This is shown in FIG. 7B. FIG. 7B is a schematic diagram showing the rising angle of the applied voltage.

Figure 7B:
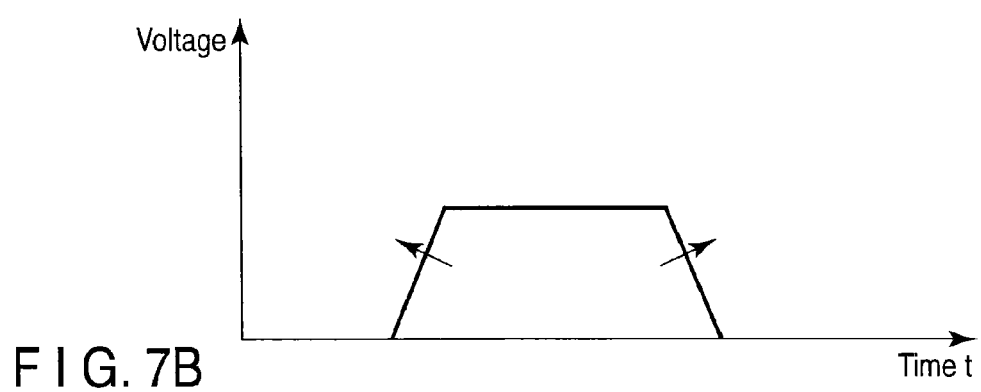

As shown in FIG. 7B, the more the arrow faces outward, the steeper the rising and falling of the applied voltage and the more easily the memory cell MC transitions to the second state. Although the magnitude of the voltage has been changed as an example, the state distribution (the first state or second state) of the memory cell MC may be changed by changing the magnitude of current I flowing in the memory cell MC or by changing the charge amount Q.

The control module 14 controls the above circuits. The control module 14 receives a command from a host device. Then, the control module 14 instructs the voltage generator 13 to generate the specific voltage so as to, for example, write, read, or erase data according to the received command.

When writing data, the control module 14 further receives write data from the host device and transfers the data to the sense amplifier 12 via a buffer (not shown).

In addition, the control module 14 controls the characteristics (the first state and the second state) of the memory cell MC. That is, the control module 14 controls the voltage generator 13 to control a voltage applied to the memory cell MC. Furthermore, the control module 14 manages the memory cell MC transitioned to the first state. The management of the memory cell MC will be described later with reference to FIG. 8.

1-6. Controlling Voltage Generator 13

With the above configuration, a method of controlling the voltage generator 13 with the control module 14 will be explained. First, a case where no current is allowed to flow in the memory cell MC, that is, a case where a reverse bias is applied to the memory cell MC and non-writing is performed, will be explained.

In this case, the control module 14 controls the voltage generator 13 so that a voltage to be transferred to a bit line BL may be lower than a voltage to be transferred to a word line WL or a voltage transferred to a word line WL and that transferred to a bit line BL may be the same. That is, the control module 14 performs control so as to transfer voltage $V_{H\_WL}$ to a word line WL and voltage $V_{L\_BL}$ (<voltage $V_{H\_WL}$) to a bit line BL.

If a positive bias is not applied to the rectification element DD, a combination of voltages transferred to a bit line BL and a word line WL may be voltage $V_{L\_BL}$ voltage $V_{L\_WL}$ or voltage $V_{H\_BL}$, voltage $V_{H\_WL}$. This prevents current from flowing in the memory cell MC. That is, the memory cell MC is brought into the unselected state.

In contrast, when a rectified current is caused to flow in a memory cell MC formed in the memory cell array 10, that is, when a forward bias is applied to the memory cell MC to write data, the control module 14 performs control so as to make lower a voltage to be transferred to a word line WL than a voltage transferred to a bit line BL. That is, voltage $V_{L\_WL}$ is transferred to a word line WL and voltage $V_{H\_BL}$ (>voltage $V_{L\_WL}$) is transferred to a bit line BL. This causes a rectified current to flow in the memory cell MC. That is, the memory cell MC is brought into a selected state.

Specifically, when data is written or erased, the signal line driver in row decoder 11 transfers voltage $V_{L\_WL}$ to the selected word line WL and the signal line driver 12-1 transfers voltage $V_{H\_BL}$ to the selected bit line BL.

In addition, a voltage whose pulse width is, for example, about 10 to 100 ns and which is lower than in erasing data so as not to change the resistance of the variable-resistance element VR, for example, 0.5 V or lower, is applied to read data held by the memory cell MC. This enables data to be sensed by sensing, for example, current flowing in a bit line or voltage on a bit line. That is, voltages transferred to a word line WL and a bit line BL are changed suitably, thereby producing a potential difference of, for example, about 0.5 V at the memory cell MC.

1-7. Management of Variable Memory Cell MC

Figure 8:
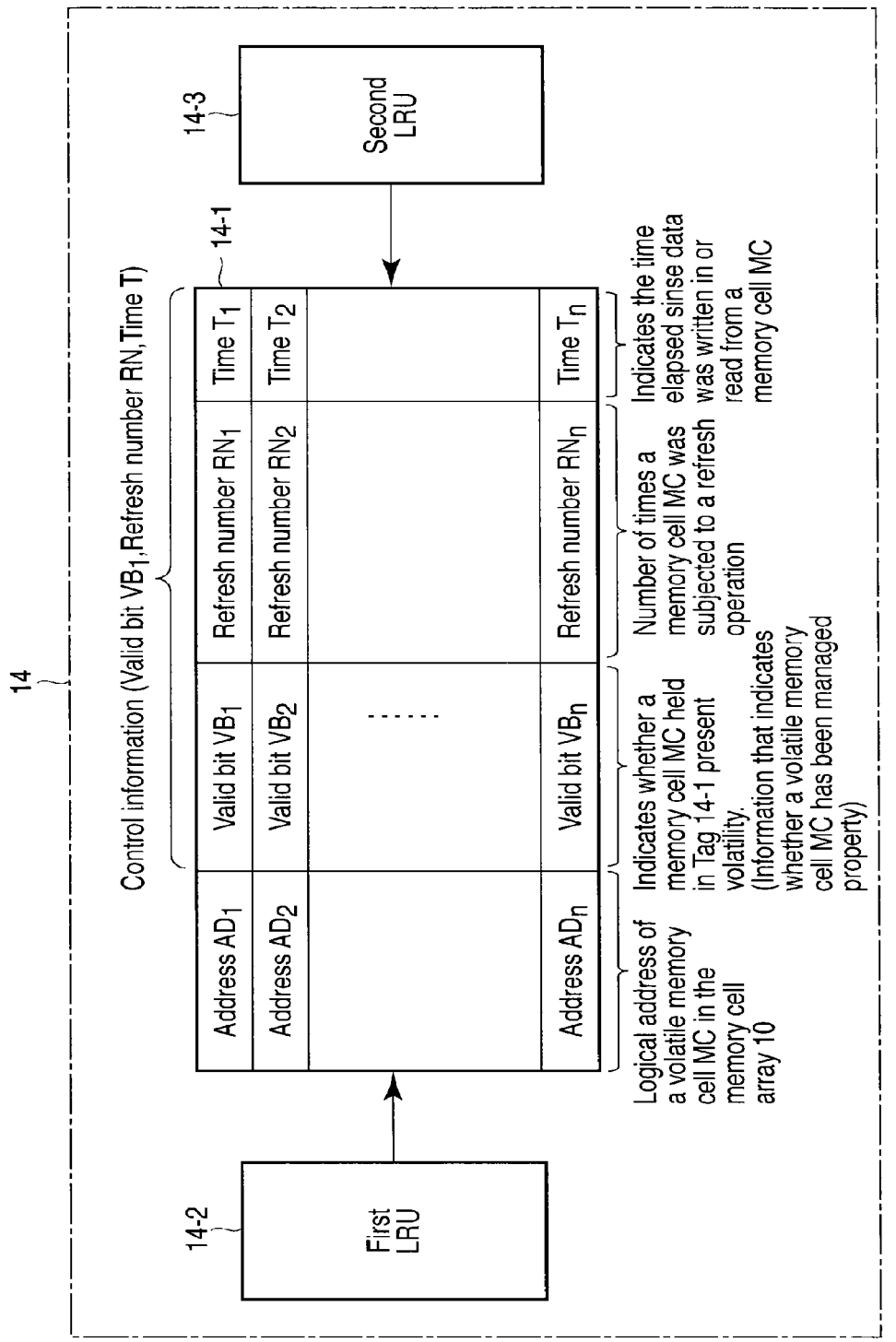
FIG. 8 is a conceptual diagram of a control module according to the first embodiment.

Next, the control module 14 will be explained with reference to FIG. 8. FIG. 8 is a conceptual diagram showing an internal configuration of the control module 14. As shown in FIG. 8, the control module 14 comprises a management Tag 14-1, a first least recent used (LRU) 14-2, and a second LRU 14-3.

1-7-1. Management Tag 14-1

Management Tag 14-1 will be explained with reference to FIG. 8. Management Tag 14-1 is a memory area composed of, for example, a nonvolatile memory and may be developed over a volatile memory to speed up data access.

Management Tag 14-1, which is provided in the memory cell array 10, holds management information (Address $AD_1$, $AD_2$, ... $AD_n$ and control information (Valid Bit $VB_1$, $VB_2$, ... $VB_n$, refresh number $RN_1$, $RN_2$, ... $RN_n$, Time $T_1$, $T_2$, ... $T_n$)) on a memory cell MC transitioned to the first state. The control information includes valid bit VB, refresh number RN, and time T.

Management Tag 14-1 manages a memory cell MC in the first state in the memory cell array 10. That is, the maximum number of memory cells MCs that can stay volatile in the memory cell array 10 depends on the amount of management information that management Tag 14-1 can store. That is, the larger the capacity of management Tag 14-1, the larger the number of volatile memory cells MC that can be managed becomes. The area in which management Tag 14-1 can store management information may be provided for $(16\times(m+1))\times(16\times(n+1))$ memory cells MCs or for a plurality of memory cell arrays 10.

In addition, management Tag 14-1 may manage memory cells MCs in the first state, for example, in units of a page, in units of a mat 12, or in units of a bundle of word lines WLs, and further in units of logical address.

Address AD indicates a logical address of a volatile memory cell MC in the memory cell array 10. For example, when memory cells are managed in units of a page, the address AD is a row address RA. In addition, when memory cells are managed in units of a logical address, the address AD holds a row address RA and a column address CA.

Valid bit VB indicates whether a memory cell MC held in management Tag 14-1 presents volatility. That is, the valid bit VB is information that indicates whether a volatile memory cell MC has been managed properly. If valid bit VB=1, this indicates that the area stores address AD of the memory cell MC and that the memory cell MC is in the first state. In contrast, if valid bit VB≠1, this indicates that the area is empty.

Refresh number RN is the number of times a memory cell MC was subjected to a refresh operation.

Time T shows the time elapsed since data was written in or read from a memory cell MC.

Management Tag 14-1 may manage memory cells MCs in units of a page, in units of a bundle of pages, or in units of mat. The more closely management Tag 14-1 manages memory cells MC, the more capacity it requires.

1-7-2. First LRU 14-2

Next, the first LRU 14-2 will be explained. The first LRU 14-2 controls a memory cell MC according to the time T in control information. Referring to control information (time T) in management Tag 14-1, the first LRU 14-2 checks how much time elapsed since data was written to or read from a memory cell MC managed by management Tag 14-1.

If there is time T longer than time T in other management information, the first LRU 14-2 determines that the chances are high that data will not be written to or read from a memory cell MC corresponding to time T. Therefore, when having received a command from the control module 14, the first LRU 14-2 selects a memory cell MC with a large time T.

Consider a case where the number of memory cells MCs transitioned from the second state to the first state by data write operations increases and the management area in management Tag 14-1 is full. In this case, when having received a command from the control module 14, the first LRU 14-2 selects a memory cell MC with the largest time T to make the management area of management Tag 14-1 empty. Then, the control module 14 brings the selected memory cell MC into the second state, that is, turns the memory cell MC into a nonvolatile memory cell MC.

Then, management tag 14-2 stores address AD information on a memory cell MC transitioned from the second state to the first state in the empty area.

1-7-3. Second LRU 14-3

Next, the second LRU 14-3 will be explained. The second LRU 14-3 controls a refresh operation of a memory cell MC. When having received a refresh command (having received a refresh trigger) from the control module 14, the second LRU 14-3 acquires an address to be refreshed. Then, the second LRU 14-3 increments control information (the number of times refreshing was performed) corresponding to the address specified by the control module 14 by one.

2. Operation of Control Module 14

2-1. Operation Part 1

Figure 9:
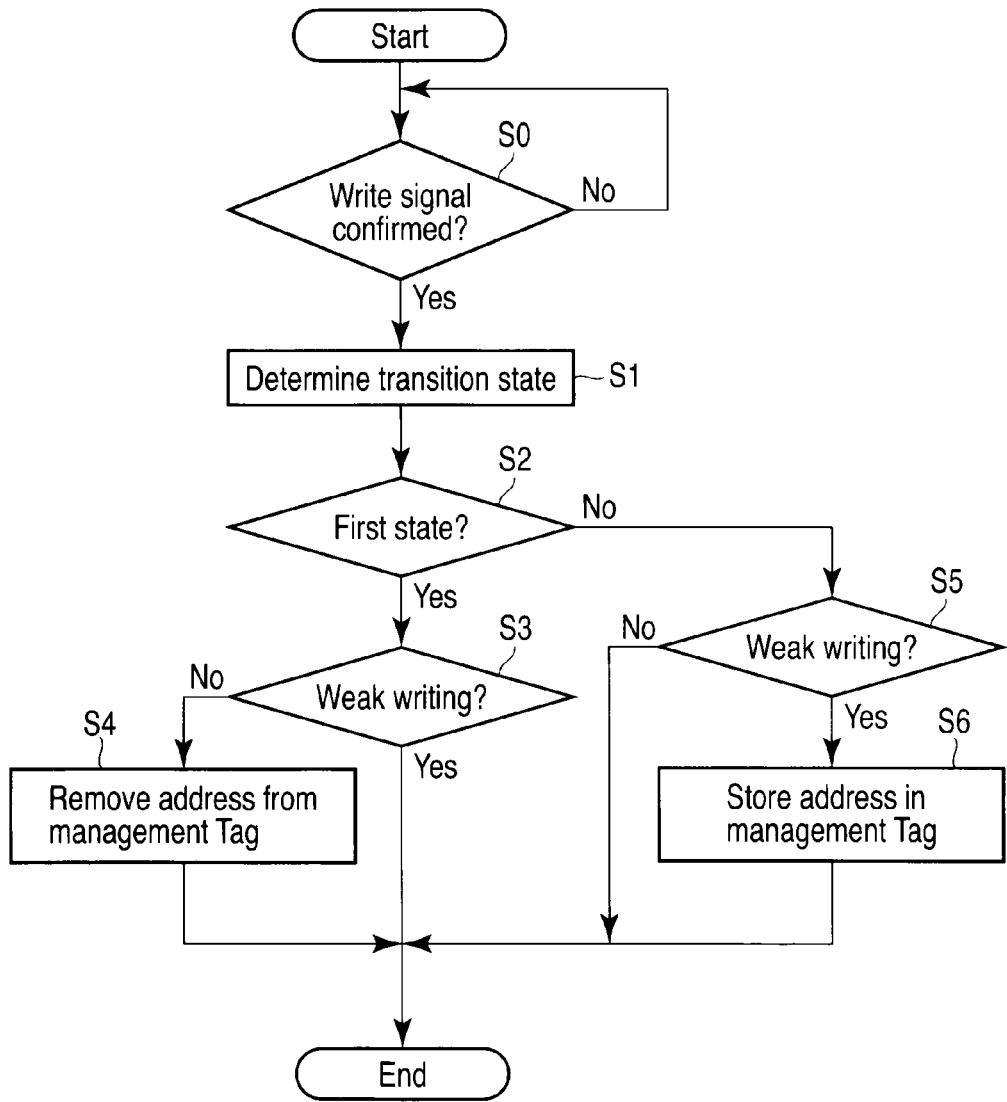

Next, an operation (part 1) of the control module 14 will be explained with reference to FIG. 9. FIG. 9 is a flowchart to explain an operation of the control module 14 in writing data. Here, writing data means writing binary 0. That is, voltage $V_{H\_BL}$ is transferred to a bit line BL and voltage $V_{L\_WL}$ is transferred to a word line WL. Specifically, for example, the potential difference between a voltage applied to a word line WL and a voltage applied to a bit line BL is changed as shown in FIG. 7 (e.g., voltage Vprog 2 is applied for Δt1) as described above.

The control module 14 checks whether there is a write signal from a host (not shown) (step S0). The write signal may be a signal for causing the state of a memory cell MC frequently written to or read from to simply transition to the first state or a signal which is for writing binary 0 and for causing the state of a memory cell MC frequently written to or read from to transition to the first state.

If there is a write signal in step S0, the control module 14 checks whether a memory cell MC corresponding to an address to be written to is the memory cell MC transitioned to the first state or the one transitioned to the second state, referring to management Tag 14-1 (S1).

If the result in step S1 has shown that the memory cell MC to be written to has transitioned to the first state (YES in S2) and this memory cell MC is to be written weakly (YES in S3), the control module 14 does nothing about the memory cell MC and causes the memory cell MC to remain in the first state because the memory cell MC to be written to has already transitioned to the first state. In this case, the memory cell MC may be written to weakly again. Alternatively, binary 0 may be written to the memory cell MC, while weak writing is performed as needed.

When a memory cell MC transitioned to the first state is written to strongly (NO in S3), the control module 14 applies the specified specific voltage to the memory cell MC, thereby causing the memory cell MC to transition to the second state. As a result, the control module 14 removes the memory cell MC transitioned to the second state from under the management of management Tag 14-1 (S4).

If a memory cell MC to be written to has transitioned to the second state (NO in S2) and the memory cell MC is to be written to weakly, that is, the memory cell MC is caused to transition to the first state (YES in S5), the control module 14 applies a specific voltage to the memory cell MC, causing the memory cell MC to transition to the first state. Then, the control module 14 causes management Tag 14-1 to store a memory cell MC transitioned from the second state to the first state (S6).

Furthermore, when the memory cell MC is written to strongly, that is, the memory cell MC is caused to transition to the second state (NO in S5), the control module 14 may write data to the memory cell MC strongly again because the memory cell to be written to has transitioned to the second state. Alternatively, the control module 14 does nothing about the memory cell MC and cause the memory cell MC to remain in the second state.

2-2. Operation Part 2

Figure 10:
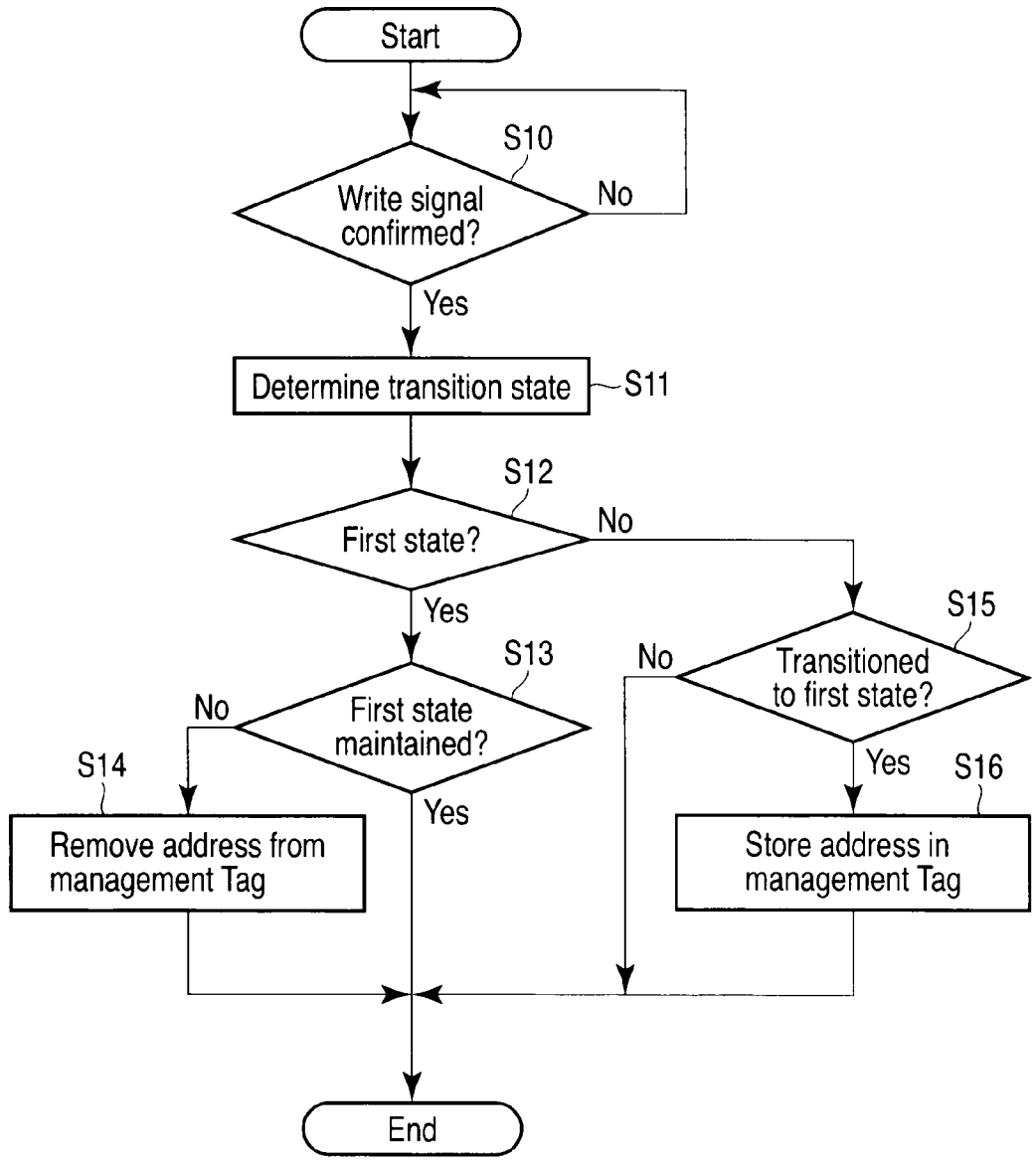

Next, an operation (part 2) of the control module will be explained with reference to FIG. 10. FIG. 10 is a flowchart to explain an operation of the control module 14 based on a memory cell MC that transitions to either the first or the second state by reading data. Since data is read, the signal line drivers 11-1 and 12-1 change the voltages transferred to word lines WLs and bit lines BLs suitably so as to cause a memory cell MC to produce, for example, a potential difference of about 0.5 V.

The control module 14 checks whether there is a read signal from a host (not shown) (step S10). When a read signal has been transferred from the host in step S10, the control module 14 checks whether a memory cell MC corresponding to an address attendant on the read signal is a memory cell MC transitioned to the first state or a memory cell MC transitioned to the second state, referring to management Tag 14-1 (S11).

If the result in step S11 has shown that there is a data read signal for a memory cell MC in the first state (YES in S12) and, after data has been read, the memory cell MC to be read from remains in the first state (YES in S13), the control module 14 causes the memory cell MC to be read from to remain stored in management Tag 14-1.

In contrast, if the memory cell MC to be read from transitions from the first state to the second state after data has been read (NO in S13), the control module 14 removes the memory cell MC to be read from under the management of management Tag 14-1 (S14).

In addition, if the result in step S11 has shown that there is a data read signal for a memory cell MC in the second state (NO in S12) and, after data has been read, the memory cell MC to be read from has transitioned from the second state to the first state (YES in S15), the control module 14 places the memory cell MC to be read from under the management of management Tag 14-1 (S16).

If the result in step S15 has shown that the memory cell MC to be read from remains in the second state (NO in S15), the control module 14 causes the memory cell MC to remain outside the management of management Tag 14-1.

2-3. Operation Part 3

Next, an operation (part 3) of the control module 14 will be explained with reference to FIG. 11. FIG. 11 is a flowchart to explain steps S6 and S16 in FIGS. 9 and 10 in detail. When there is a write command and a read command from a host, the control module 14 refers to the first LRU 14-2 and manages a memory cell MC in the first state.

When there is a memory cell MC transitioned to the first state by data writing or reading, the control module 14 checks whether there is an area in which an address and control information corresponding to the address are to be stored (S21), referring to management Tag 1401 (S20).

If there is the area in step S21 (YES in S21), that is, if there is an area where "valid bit VB≠1," the control module 14 stores the address of a memory cell MC transitioned to the first state and its corresponding control information in the area (S22).

In contrast, if the area is full in management Tag 14 (NO in S21) in step S21, that is, if "valid bit VB=1" for all the area, the control module 14 refers to the first LRU 14-2 and selects an address at which time T has elapsed for the longest time in management Tag 14-1 (S23).

In other words, an address that has not been accessed continuously, that is, an address which has neither been read from nor been written to continuously, is selected. In this case, the control module 14 refers to time T using the first LRU 14-2, thereby selecting an address with a large time T.

Next, the control module 14 causes a memory cell MC corresponding to the address selected in step S23 to transition from the first state to the second state (S24) and removes the address from under the management of management Tag 14-1 (S25).

After step S25, the control module 14 stores the address of the memory cell MC transitioned to the first state in step S11 in an empty area (an area with valid bit VB≠1) (S26).

2-4. Operation Part 4

Figures 12, 13:
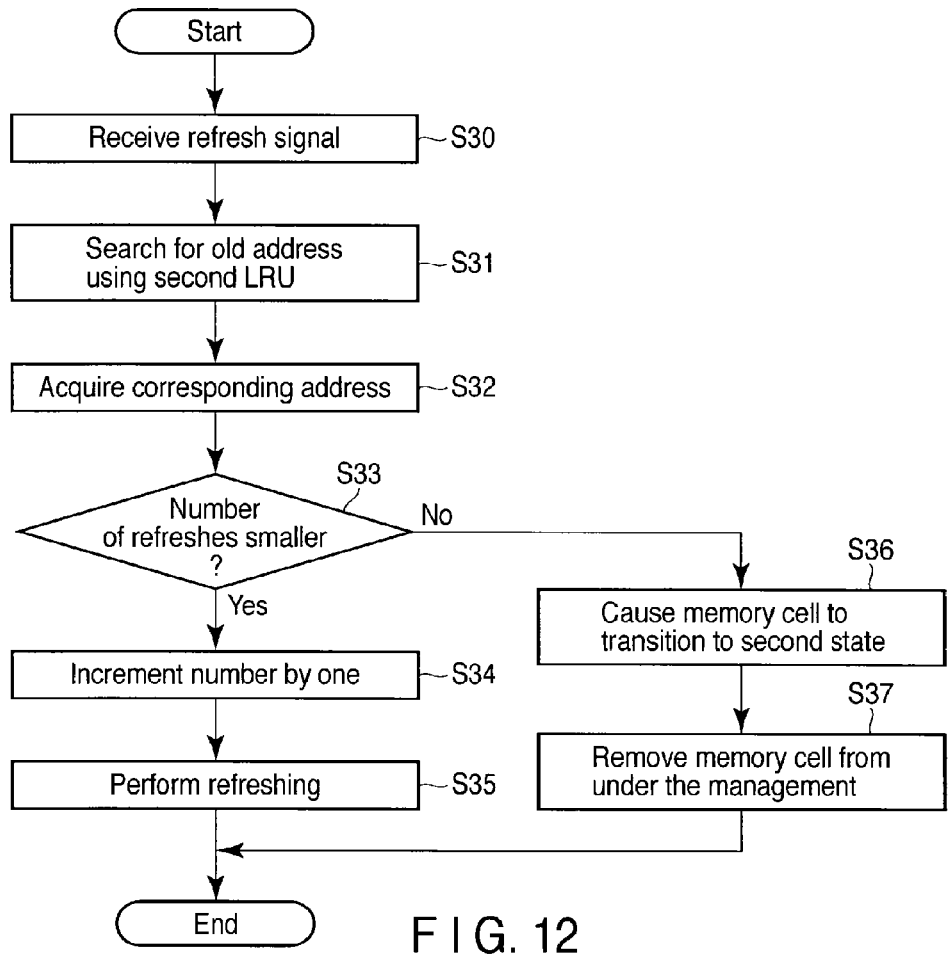

Next, an operation (part 4) of the control module 14 will be explained with reference to FIG. 12. FIG. 12 is a flowchart to explain an operation of the control module 14 when having received a refresh operation request signal from a host (not shown). In this embodiment, suppose both a write command and a read command correspond to a refresh operation from the viewpoint of the memory cells MCs.

That is, when having received not only a refresh signal but also a write signal, and a read signal, the control module 14 refers to the second LRU 14-3. As described above, even when having received not only a refresh signal but also a write signal, and a read signal, the control module 14 manages memory cells MCs in the first state using management Tag 14-1. Although the explanation below will be given, focusing on a case where a refresh signal is supplied from a host (not shown), an operation is performed according to the flow described below even when a write signal or a read signal is supplied. Therefore, an explanation of operations related to a write signal and a read signal will be omitted.

When having received a refresh signal (trigger) from a host (not shown) (S30), the control module 14 searches for an address at which the longest time has elapsed since writing, reading, or refreshing was performed, referring to the second LRU 14-3 (S31). Then, the control module 14 acquires the corresponding address from management Tag 14-1 (S32). Thereafter, the control module 14 refers to the number of times refreshing was performed in control information on the acquired address. If the number of times refreshing was performed is smaller than a predetermined number of times (YES in S33), the control module 14 increments the number of times by one (S34) and performs a refresh operation on the memory cell MC at the address specified by the refresh command (S35).

In contrast, if the number of times refreshing was performed is larger than the predetermined number of times (NO in S33), the control module 14 causes the memory cell MC at this address to transition from the first state to the second state (S36). That is, the control module 14 applies a specific voltage to the signal line driver to perform control so as to cause the electric characteristic to transition from volatility in the first state to nonvolatility in the second state.

Thereafter, the control module 14 removes the memory cell MC transitioned to the second state from the area of management Tag 14-1 (S37). This produces an empty area in the management area of management Tag 14-1.

Next, the way the second LRU 14-3 ranks memory cells MCs as an object to be refreshed and the way the first LRU 14-2 ranks memory cells MCs as a memory cell MC caused to transition to the second state will be explained with reference to FIG. 13. FIG. 13 is a table showing whether there is a change in the order in which memory cells MCs are to be refreshed when a write operation, a read operation, or a refresh operation has been performed.

As shown in FIG. 13, when a refresh operation has been performed, the second LRU 14-3 lowers the rank of a memory cell MC subjected to a refresh operation (Moving down in ranking). That is, the memory cell MC is made lower in the ranking from a rank at which it is to be refreshed to a rank at which it is allowed not to be refreshed for a specific period. When a refresh operation has been performed, the ranks of memory cell MC are not changed (Unchanged) by the first LRU 14-2.

When having a write command, the first LRU 14-2 lowers the memory cell MC in the ranking of transitioning to the second state (Moving down in ranking). That is, since data has been newly written in a write operation, there is a possibility that data will be written again. Therefore, the memory cell MC is not caused to transition to nonvolatility and is maintained in the first state where a write speed is high.

In addition, in the case of a memory cell MC for which the write command corresponds to a refresh operation, that is, in the case of a memory cell MC for which a write operation corresponds to a refresh operation, the second LRU 14-3 lowers the memory cell MC in the ranking down to a rank at which a memory cell MC is allowed not to be refreshed for a specific time (Moving down in ranking (condition 1) (condition 1: when write operation corresponds to refreshing).

When a read command has been performed, the first LRU 14-2 lowers the memory cell MC in the ranking of transitioning to the second state (Moving down in ranking). That is, since data has been newly read in a read operation, there is a possibility that data will be read again. Therefore, the memory cell MC is not caused to transition to nonvolatility and is maintained in the first state where a read speed is high.

In addition, in the case of a memory cell MC for which the read command corresponds to a refresh operation, that is, in the case of a memory cell MC for which a read operation corresponds to a refresh operation, the second LRU 14-3 lowers the memory cell MC in the ranking down to a rank at which a memory cell MC is allowed not to be refreshed for a specific time (Moving down in ranking (condition 1)).

With the semiconductor memory device according to the first embodiment, the electric characteristic of the same memory cell MC can be changed as needed.

In the semiconductor memory device of the first embodiment, the signal line drivers provided in the row decoder 11 and sense amplifier 12 respectively can change the voltage Vrpog applied to signal lines (bit line BL and word line WL) sandwiching a memory cell MC between them and/or the applying time of the voltage Vrpog. This causes the electric characteristic of the same memory cell MC to transition to either a volatile or a nonvolatile state.

Accordingly, in the memory cell array 10, for example, a memory cell MC frequently written to or read from is caused to transition to the first state, thereby making it possible to realize quick data transfer to an external device (host).

In contrast, a memory cell MC which is less frequently written to or read from and holds data for a long time is caused to transition to the second state. Accordingly, the necessity of always performing a refresh operation is reduced and therefore the power consumption of the entire semiconductor chip can be suppressed.

In addition, with the semiconductor memory device of the first embodiment, it is possible to suppress the processing time, make the use area more efficient, and suppress the power consumption.

According to the first embodiment, there is provided a semiconductor memory device capable of improving the data processing time by causing a memory cell frequently accessed to transition to volatility and efficiently changing the area ratio of volatile memory cells to nonvolatile memory cells according to data traffic.

With the semiconductor memory device of the first embodiment, when the number of memory cells MCs that frequently exchange data with an external device (host) as described above has increased, the memory cells MCs are caused to transition to the first state, thereby making it possible to make shorter the time required to read or write data.

That is, memory cells MCs frequently accessed are caused to transition to the first state depending on the situation instead of allocating memory cells MCs transitioned to the first state fixedly to, for example, an area after a certain page of the memory cell array and further of allocating memory cells MCs transitioned to the second state to an area after the page. As compared with a case where the memory cells MCs transitioned to the first and second states are always allocated fixedly, quick processing can be realized by causing memory cells MCs frequently accessed to transition to volatile memory cells MCs capable of writing and reading data quickly.

Furthermore, in the semiconductor memory device of the first embodiment, a memory cell MC that can transition to either the first or second state is formed in the same memory cell array 10. A memory cell MC transitioned to the first state can operate as if it were, for example, a DRAM used in a cache area. That is, an area where a memory cell MC transitioned to the first state can be used as a cache area. Therefore, the memory cell array 10 can function as a cache area that would originally be provided, realizing area reduction. In this way, the limited memory area can be used efficiently.

This is because the control module 14 includes management Tag 14-1, first LRU 4-2, and second LRU 14-3 that manage volatile memory cells MCs and perform control so as to cause memory cells MCs frequently accessed to transition to volatility.

As described above, for example, even when data has been transferred frequently, the control module 14 refers to the first LRU 14-2, removes a memory cell MC less frequently accessed from management Tag 14-1, and stores a memory cell MC frequently accessed in management Tag 14-1. That is, a memory cell MC which is less accessed by an external device (host) and which has not been accessed for a specific time or longer is caused to transition to a nonvolatile memory cell MC capable of holding data for a long time. Therefore, a refresh operation need not be performed a plurality of times, enabling the power consumption to be suppressed.

Furthermore, referring to the second LRU 14-3, the control module 14 removes a memory cell MC subjected to a refresh operation a specific number of times or more from under the management of management Tag 14-1. That is, a memory cell MC which is accessed less frequently (or written to or read from less frequently) and which is subjected to a refresh operation frequently is caused to transition to a nonvolatile memory cell MC. This makes it possible to cause a memory cell MC frequently accessed to transition to volatility, realizing efficient use of the area.

(i) While in the first embodiment, the magnitude of voltage has been changed, either current I or charge amount Q may be changed instead of voltage. Parameters to be changed may be combinations of the voltage, current, and charge amount.

(ii) While the voltage waveform (rising and falling) has been changed, current I or charge amount Q may be changed.

(iii) While the voltage applying time has been changed, either current I or charge amount Q may be changed instead of the voltage. Parameters to be changed may be combinations of the voltage, current, and charge amount.

Furthermore, (i) to (iii) may be combined suitably. Alternatively, any one of (i) to (iii) may be selected.

First Modification of the First Embodiment

Next, a semiconductor memory device according to first modification of the first embodiment will be explained. The first modification is such that a minimum unit of control information is provided in the memory cell array 10 in place of management Tag 14-1. Specifically, control information held by the memory cell array 10 is information as to whether a memory cell MC in the memory cell array 10 has transitioned to either state (either the first state (volatile state) or the second state (nonvolatile state). The control information is a minimum unit of information, that is, 1-bit information. Specifically, the control information is, either binary 0 indicating, for example, a high-resistance state or binary 1 indicating, for example, a low-resistance state. Here, for example, when control information is binary 0, the control module 14 determines that the memory cell MC is in the first state (volatile state). When control information is binary 1, the control module 14 determines that the memory cell MC is in the second state (nonvolatile state). An explanation of the same configuration as that of the first embodiment will be omitted.

<Memory Cell Array 10>

Figure 14:
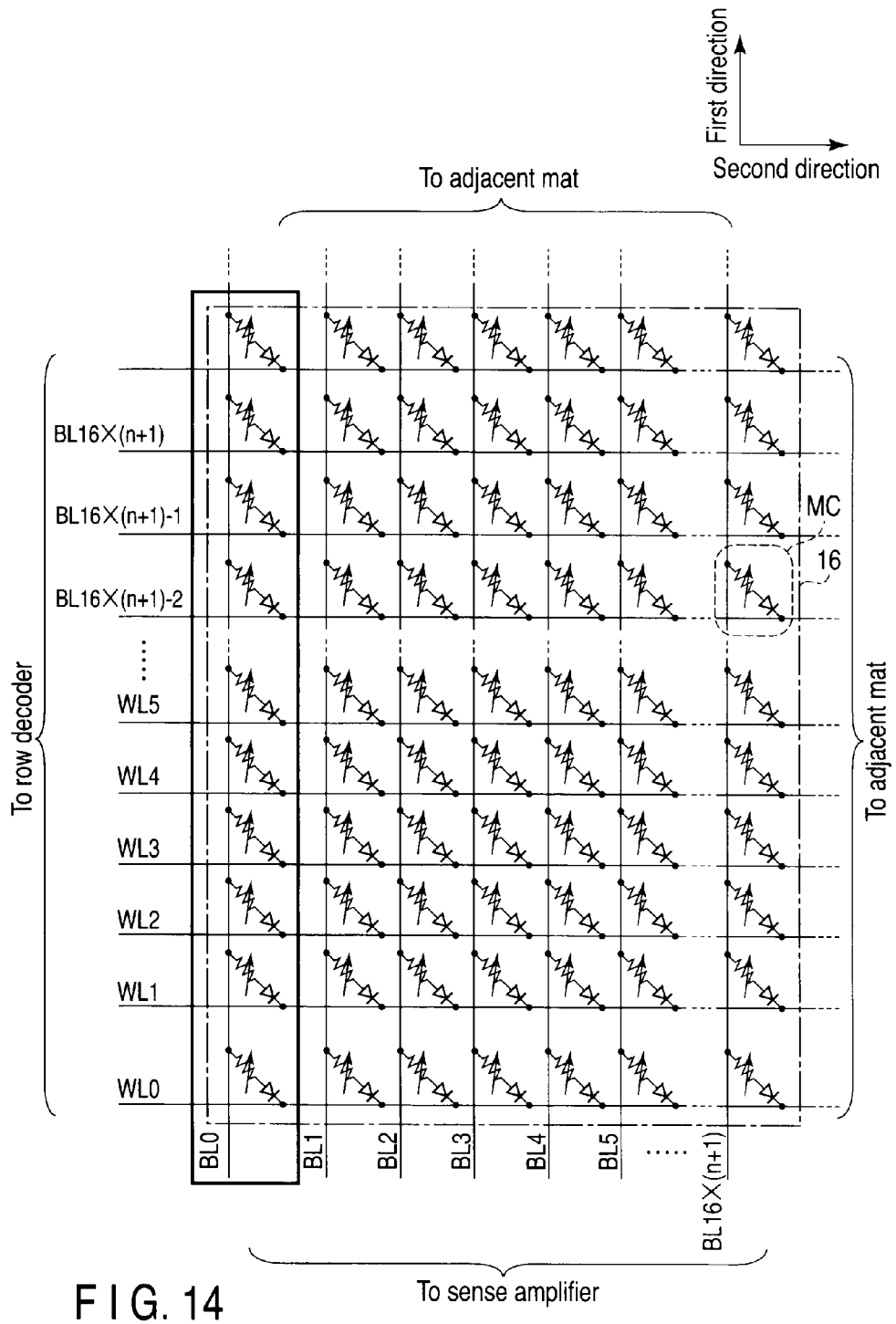
FIG. 14 is a schematic diagram of a memory cell array provided with control information according to a modification of the first embodiment.

A schematic diagram of a semiconductor memory device according to the first modification will be explained with reference to FIG. 14. FIG. 14 is a schematic diagram of the memory cell array 10. As shown in FIG. 14, the memory cells MCs provided at the left end (bit line BL0) (in an area shown by a bold line) of the memory cell array 10 are caused to store control information (either binary 1 or binary 0). Specifically, the memory cells MCs at the intersections of bit line BL0 and word lines WL0 to WL15 are caused to store control information. Each of these memory cells MCs manages the state distribution of memory cells MCs in the same row as that of the memory cell MC that holds control information.

Specifically, when a memory cell MC at the left end holds binary 0, the control module 14 determines that a plurality of memory cells MCs in the same row as that of the memory cell MC have transitioned to the first state. That is, the control module 14 determines that the area is a volatile area.

In contrast, when a memory cell MC at the left end holds binary 1, the control module 14 determines that a plurality of memory cells MCs in the same row as that of the memory cell MC have transitioned to the second state. That is, the control module 14 determines that the area is a nonvolatile area.

Although the number of bit lines BLs is 16 in FIG. 5, it is not limited to this. For instance, the number of bit lines BLs may be, for example, $2\times10^3$ or $8\times10^3$. That is, a management unit may be an erase unit, a write unit, or a unit a plurality of times each of these units. In this case, the number of bit lines BLs is set to $16\times(n+1)$. Therefore, the management unit is $16(n+1)$ lines.

With the above configuration, the control module 14 determines which memory cell MC is in the first state or the second state, referring to the data held by the memory cell MC at the left end. According to a command (such as a write command or a read command) from the host, the control module 14 performs the same operation (refer to FIGS. 9 to 13) as in the first embodiment.

For example, the second LRU 14-3 refers to control information held by the memory cell MC at the left end and performs a refresh operation on the memory cells MCs in the same row as that of the memory cell MC that holds binary 0. In this way, rewriting the data held by the memory cell MC referred to by the first and second LRUs enables the entire area of the memory cell array 10 to be controlled, while distinguishing between volatile and nonvolatile on a management unit basis.

While a memory cell MC in the memory cell array 10 has been caused to hold minimum control information in place of management Tag 14-1, management Tag 14-1 may be provided in the control module 14. That is, the first LRU 14-2 and second LRU 14-3 may perform an operation according to FIGS. 9 to 13, while referring not only to control information in management Tag 14-1 but also to control information held by the memory cell MC arranged at the left end.

While the memory cell MC at the left end holds information on the state distribution of memory cells MCs in the same row, the memory cells MCs are not limited to the same row.

For instance, they may be located in any physical places, provided that they (the memory cell MC at the left end and the memory cells MCs arranged in the same row as that of the memory cell MC) are logically-related to one another.

Data (control information, the first state, and the second state) held by each of the memory cell MC at the left end and the memory cells MCs arranged in the same row may be sensed and amplified by a sense amplifier 12 sequentially in a time-division manner. Alternatively, a sense amplifier 12 may be arranged for each bit line BL and the sense amplifier 12 corresponding to each bit line BL may sense data separately. This makes it possible to determine whether a memory cell MC is in the first state or the second state.

Second Modification of the First Embodiment

Next, a semiconductor memory device according to a Second modification of the first embodiment will be explained. In the second modification, another configuration of the signal line driver 12-1 explained in the first embodiment will be explained.

<Configuration>

Figure 15:
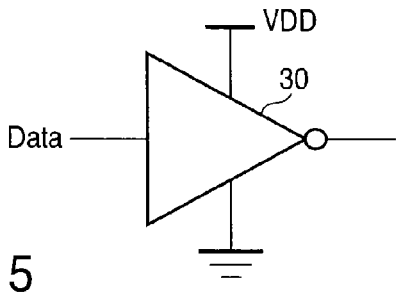
FIG. 15 is a schematic diagram of a memory cell array according to a second embodiment, with a volatile memory cell area and a nonvolatile memory cell area being separated from each other.

A signal line driver 12-1 according to the second modification will be explained with reference to FIG. 15. As shown in FIG. 15, the signal line driver 12-1 comprises an inverter 30. As is well known, the inverter 30 is composed of a p-channel MOS transistor (hereinafter, referred to as MOS transistor 30p) and an n-channel MOS transistor (hereinafter, referred to as MOS transistor 30n) connected in series.

As shown in FIG. 15, a variable voltage VDD is supplied to one end of the current path of MOS transistor 30p. The other end of the current path is connected to one end of the current path of MOS transistor 30n. A bit line BL selection signal is input to the gate of MOS transistor 30p. A node to which MOS transistor 30p and MOS transistor 30n are connected is an output end. The other end of the current path of MOS transistor 30n is connected to the ground. The bit line BL selection signal is input to the gate of MOS transistor 30n. That is, when the bit line BL selection signal is made low and the output is made high, a bit line BL is precharged to a voltage corresponding to the variable voltage VDD. In this way, making variable the voltage VDD supplied to one end of the current path of MOS transistor 30p enables, for example, voltage Vprog1 or voltage Vprog2 as shown in FIG. 7A to be output. The signal line driver circuit 12-1 can be switched between on and off according to the high or low level of the bit line BL selection signal. Accordingly, as shown in FIG. 7A, it is clear that the driving time of the signal line driver 12-1 can be switched between Δt1 and Δt2.

Third Modification of the First Embodiment

Next, a semiconductor memory device according to a third modification of the first embodiment will be explained. In the third modification, still another configuration of the signal line driver 12-1 explained in the first embodiment will be explained. A signal line driver 12-1 according to the third modification includes a plurality of inverters and changes the rise angle of the voltage as shown in FIG. 7B, by changing the current according to the number of inverters driven.

<Configuration>

Figure 16:
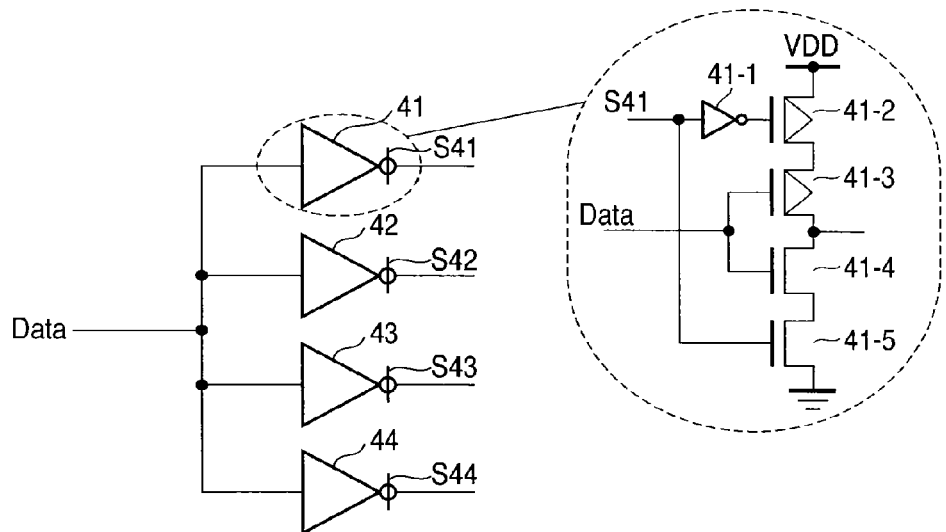
FIG. 16 is a schematic diagram of a memory cell array according to a modification of the second embodiment, with a volatile memory cell area and a nonvolatile memory cell area being separated from each other.

The signal line driver 12-1 of the third modification will be explained with reference to FIG. 16. As shown in FIG. 16, the signal line driver 12-1 comprises clocked-inverters 41 to 44. Signal Data is input to the clocked-inverter 41 to 44. Signal Data is either low or high. Furthermore, signal S41 to S44 corresponded to clocked-inverters 41 to 44 are input to the clocked-inverters 41 to 44. That is, the clocked-inverters 41 to 44 output inverted signal of signal Data according to signal S41 to S44.

A detailed configuration of the clocked-inverter 41 will be explained as an example. Meanwhile, since each of a configuration of the clocked-inverters 42 to 44 is identical to that of the clocked-inverter 41, the description thereof is omitted.

The clocked-inverter 41 includes inverter 41-1, p-channel-MOS transistor 41-2, 41-3, n-channel-MOS transistor 41-4, and 41-5. The voltage VDD is supplied to one end a current pathway of a MOS transistor 41-2, and an output signal of inverter 41-1 is supplied to a gate thereof. One end of a current pathway of a MOS transistor 41-3 is connected to the other end of the current pathway of the MOS transistor 41-2, the other end thereof functions as output end, and the signal Data is supplied to a gate thereof. Furthermore, one end of a current pathway of a MOS transistor 41-4 is connected to the other end of the current pathway of the MOS transistor 41-3, and the signal Data is supplied to a gate thereof. One end of a current pathway of a MOS transistor 41-5 is connected to the other end of the current pathway of the MOS transistor 41-4, the other end thereof may be connected to the ground, and a signal S41 is supplied to a gate thereof. That is, when the signal S41 is High, the clocked-inverter 41 inverts the signal Data and outputs an inverted signal Data.

If all the inverters 41 to 44 output high signals according to the signals S41 to S44, the current of the signal line driver 12-1 becomes maximum. If one of the inverters 41 to 44 is selected, the current of the signal line driver 12-1 becomes minimum. In this manner, by selecting the level of signal S41 to 44, the voltage may be varied as shown in FIG. 7B.

Meanwhile, the output voltages of the clocked-inverters 41 to 44 also may be varied by supplying each of different voltages in advance, as the power supply, to each of clocked-inverters. At the time, clocked-inverters driven simultaneously among the clocked-inverters 41 to 44 are only clocked-inverter supplied the same voltage among the clocked-inverters 41 to 44. That is, selecting the clocked-inverter made to drive means selecting the voltage which drives the clocked-inverter, the signal line driver 12-1 may outputs different voltages For example, the maximum output of the signal line driver 12-1 is set as voltage Vprog1 in FIG. 7A and the minimum output is set as voltage Vprog2 in FIG. 7A.

Even the signal line driver 12-1 of the third modification can turns on or off the signal line driver circuit 12-1 according to the high and low levels of the bit line BL selection signal. Therefore, as shown in FIG. 7A, it is clear that the driving time of signal line driver 12-1 can be switched between Δt1 and Δt2.

Fourth Modification of the First Embodiment

Next, a semiconductor memory device according to a fourth modification of the first embodiment will be explained. A semiconductor memory device according to the fourth modification uses a 1Tr1R where a variable resistance R and a MOS transistor constitute a memory cell MC instead of an Re-RAM.

<Configuration>

Figure 17:
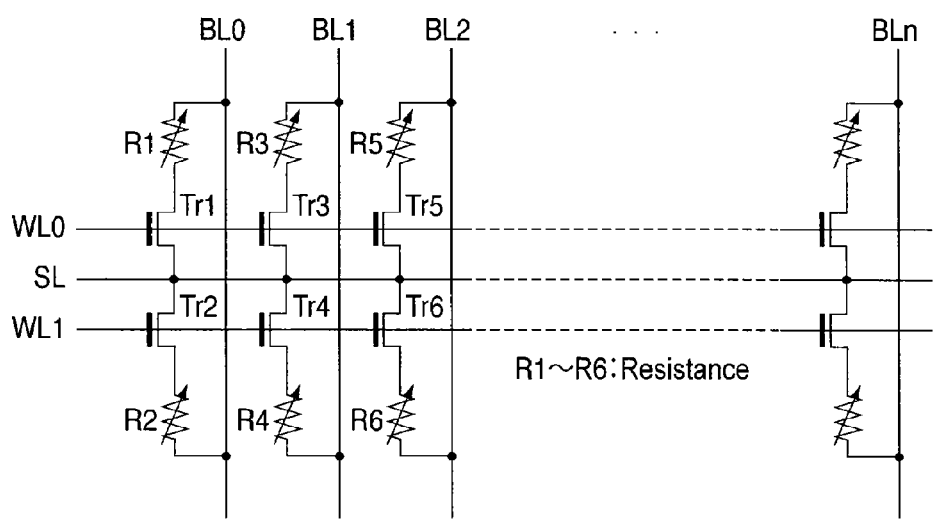
FIG. 17 is a circuit diagram of signal line driver according to the first modification of the first embodiment.

A configuration of a memory cell array according to the fourth modification will be explained with reference to FIG. 17. As shown in FIG. 17, the memory cell array comprises a plurality of memory cells MCs connected to bit lines BLs and word lines WLs. Two memory cells MCs and the two variable resistances, which are connected to a source line SL in common connection form, are provided to each of the bit lines BLs. That is, one end of the current path of variable resistance R1 is connected to bit line BL0. The other end of the current path of variable resistance R1 is connected to one end of the current path of MOS transistor Tr1. The other end of the current path of MOS transistor Tr1 is connected to source line SL. The gate of MOS transistor Tr1 is connected to word line WL0. One end of the current path of MOS transistor Tr2 is connected to the other end of MOS transistor Tr1 with source line SL. The other end of the current path of MOS transistor Tr2 is connected to one end of the current path of variable resistance R2. The gate of MOS transistor Tr2 is connected to word line WL1. Bit line BL0 is connected to one end of the current path of variable resistance R2. That is, one end of the current path of variable resistance R1 is connected to the other end of the current path of variable resistance R2 via bit line BL0 in common connection form.

Each of bit lines BL1 to BLn has the same configuration as that of bit line BL0. A memory cell array is formed so as to have this configuration. As in the second embodiment, the number of memory cell arrays is not limited to one. Two or more memory cell arrays 1 may be formed consecutively.

<Write Operation>

Next, the operation of writing data to a memory cell MC will be explained briefly with reference to FIG. 17. Since the fourth modification is the same as what has been explained in the first embodiment, expect for the configuration of a memory cell MC, a redundant explanation will be omitted.

The row decoder 11 selects either word line WL0 or word line WL1. That is, the row decoder 11 transfers a high signal to the selected word line WL. This turns on the MOS transistor connected to the selected word line WL. Each of the bit lines BLs is electrically connected to source line SL via resistive element R corresponding to the selected word line WL.

Then, when a write voltage is transferred from bit line BL, the state of variable resistance R (Resistances R1-R6) corresponding to the selected word line WL changes according to the voltage, the time during which the voltage is applied to variable R resistances R1-R6, and the rise time of the voltage. Accordingly, variable resistances R1-R6 can take either the first state or the second state. In a data read operation, such a voltage as prevents the state of variable resistances R1-R6 from changing is transferred from bit line BL, thereby reading a current flowing in variable resistances R1-R6.

Second Embodiment

Next, a semiconductor memory device according to a second embodiment will be explained with reference to FIG. 18. FIG. 18 is a schematic diagram of a memory cell array 10 divided into a volatile area and a nonvolatile area.

As shown in FIG. 18, memory cells MCs transitioned to the second state are located in an area (an area surrounded by a bold line) above a certain page serving as a boundary, whereas memory cells MCs transitioned to the first state are located in an area (an area surrounded by a thin line) below the boundary.

In this case, the control module 14 holds at least the row address of the page serving as the boundary (a page of volatile memory cells MCs or a page of nonvolatile memory cells MCs). Therefore, it can be determined that physical addresses before the row address belong to the area of volatile memory cells MCs and physical addresses after the row address belong to the area of nonvolatile memory cells MCs.

When a memory cell MC is accessed, it is conceivable that a nonvolatile memory cell MC slow in reading and writing data is accessed, depending on the transferred logical address, because an address transferred from an external device (host) is a logical address.

In this case, the control module 14 controls addresses so that the logical address transferred from the host may correspond to the area where volatile memory cells MC have been arranged.

With the semiconductor memory device according to the second embodiment, a reduction in the area and a decrease in the manufacturing processes can be realized.

In the semiconductor memory device of the second embodiment, data expected to be frequently written or read is stored in a first area in FIG. 18. In contrast, data less frequently accessed, such as system data or control data, is stored in nonvolatile memory cell MCs.

As described above, since the same memory cell MC in the memory cell array 10 of the second embodiment can transition to either characteristic, there is no need to manufacture, for example, a nonvolatile memory cell array and a cache composed of an SRAM separately. That is, volatile memory cells MCs can be caused to function as a cache of nonvolatile memory cells, while reducing manufacturing processes. That is, area reduction can be realized.

In addition, the control module 14 has only to determine the boundary between volatility and nonvolatility. That is, as described above, at least the control module 14 has only to be capable of holding row address RA used as the boundary. Therefore, control is simplified and the first LRU 14-2, second LRU 14-3, and management Tag 14-1 may not be formed in the control module 14 differently from the first embodiment. That is, the effect of reducing the area can be obtained.

Modification of the Second Embodiment

Next, a semiconductor memory device according to a modification of the second embodiment will be explained with reference to FIG. 19. FIG. 19 is a schematic diagram of the memory cell array 10 when the ratio of the volatile area to the nonvolatile area can be changed according to traffic in FIG. 18.

As shown in FIG. 19, an area above a certain row address serving as a boundary is caused to transition to nonvolatile memory cells MCs, whereas an area below the boundary is caused to transition to volatile memory cells MCs.

Even in this case, the control module 14 has only to hold at least the row address of the page serving as the boundary. When traffic is high, that is, when data is frequently written or read, the proportion of the area of volatile memory cells MCs is made larger. That is, the control module 14 controls row address RA so as to increase the proportion of the area of volatile memory cells MC.

In contrast, when traffic is low, when data is held for a long time, or when greater electric power is consumed by a refresh operation, the proportion of the area of nonvolatile memory cells MCs is made larger. That is, the control module 14 controls row address RA so as to increase the proportion of the area of nonvolatile memory cells MCs.

In addition, row address RA may be controlled using the first LRU 14-2, second LRU 14-3, and management Tag 14-3.

The semiconductor memory device according to the modification produces not only the effect of realizing a reduction in the area and a decrease in the manufacturing processes but also the effect of making it easier to control the area ratio according to traffic.

With the semiconductor memory device of the modification, the control module 14 has only to hold at least row address RA of the boundary between the volatile area and the nonvolatile area. Therefore, when the memory cell array is frequently accessed by an external device (host) as in writing or reading, the proportion of the volatile area is made larger than that of the nonvolatile area by controlling row address RA. That is, if the memory cell array 10 may be divided into nonvolatile memory cells MCs and volatile memory cells MC functioning as a cache for the nonvolatile memory cells, with a certain page in the memory cell array 10 as a boundary, the memory cell array 10 can operate without providing the first LRU 14-2, second LRU 14-3, and management Tag 14-1.

The control module 14 may be provided on the host side (not shown).

In the semiconductor memory device of the second embodiment, the area further includes address AD corresponding to a memory cell MC transitioned to the first state, control information includes first information that indicates whether a memory cell MC held in the area is in the first state, second information that indicates the time elapsed since data was written or read, and third information that indicates the number of times a memory cell MC was refreshed.

In addition, in the semiconductor memory device of the second embodiment, a memory cell MC includes a rectification element DD and a variable-resistance element VR.

Moreover, in the semiconductor memory device of the second embodiment, the control module 14 causes a memory cell MC for which the number of times refreshing was performed managed by the second management module 14-3 has reached a specified value is caused to transition from the first state to the second state.

Furthermore, in the semiconductor memory device of the second embodiment, when a memory cell MC in the second state in the memory cell array 10 has transitioned to the first state, the first management module 14-2 refers to management Tag 14-1, causes a memory cell MC with the longest elapsed time to transition to the second state, and then removes the memory cell MC transitioned to the second state from under the management.

In addition, in the semiconductor memory device of the second embodiment, a memory cell MC in the first state presents volatility and a memory cell MC in the second state presents nonvolatility. The memory cell MC in the first state has a shorter data holding time than that in the second state.

Third Embodiment

Next, a semiconductor memory device according to a third embodiment will be explained. A semiconductor memory device according to the third embodiment causes a memory cell MC to hold multilevel data on the basis of a physical quantity indicating the characteristic of the memory cell described above. Specifically, a memory cell MC is caused to hold multilevel data on the basis of physical quantities of the memory cell, including, for example, not only the magnitude of a resistance but also various characteristics, including data retention characteristics, and write characteristics, and combinations of them as explained in FIG. 4.

<Retention Data>

As described above, a memory cell MC of the third embodiment is caused to hold multilevel (e.g., 4-level) data by combining a plurality (2 or more) of physical quantities (holding 2-level data (either 0 or 1) with one physical quantity). First, the physical quantities of a memory cell MC will be explained. In an explanation of physical quantities below, suppose a memory cell MC can hold 1-bit data with each physical quantity.

<Physical Quantity: Resistance>

Figures 20, 21:
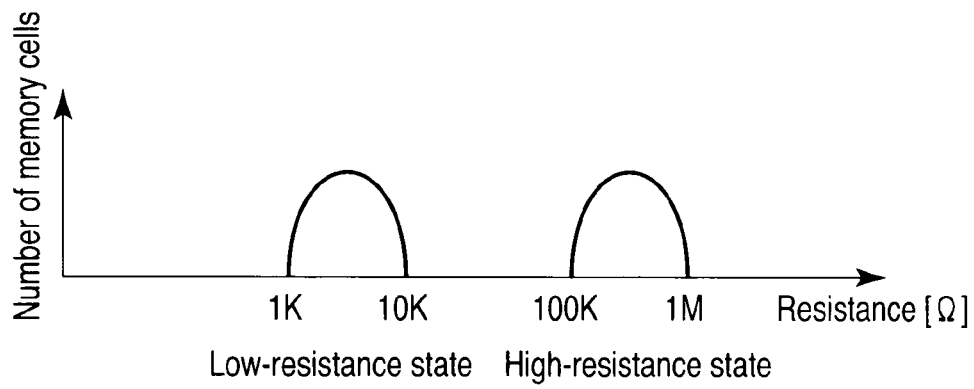
FIG. 20 is threshold distribution of the memory cell according to the third embodiment.
FIG. 21 is a schematic diagram of the multi-value data which the memory cell has when physical quantities are combined according to the third embodiment.

First, according to different physical quantities of memory cells MCs, a case where each of memory cells MCs holds 1-bit data will be explained. An explanation will be given, focusing attention on a resistance as a practical physical quantity. As described above, the memory cell MC holds 1-bit data (2-level data), depending on whether the resistance of a memory cell MC high or low. This is shown in FIG. 20. As shown in FIG. 20, the memory cell MC can hold 1-bit data, depending on whether the resistance is high or low. For example, the memory cell MC can hold binary 1 in a low-resistance state and binary 0 in a high-resistance state.

<Physical Quantity: Rewrite Time>

An explanation will be given, focusing attention on rewrite time as the next physical quantity. Rewrite time is the ease of transition of the state of a memory cell MC. Specifically, rewrite time is the ease of transition concerning whether a memory cell MC transitions to another state when a certain voltage is just applied for a short time $\Delta t1$ or only when a certain voltage is applied for a long time $\Delta t2$.

Specifically, first, data is read from a memory cell MC and the read data is held temporarily. Then, a voltage is applied for, for example, a short time (e.g., $\Delta t1$, see FIG. 7) to try writing data. Data is read from the memory cell MC again. The read data is compared with the temporarily held data. Suppose the comparison result has shown that, for example, the memory cell MC has transitioned from the first state to the second state. Therefore, it is determined that the memory cell MC has a short rewrite time, that is, the memory cell MC tends to transition. For example, this is determined to be binary 0 from a viewpoint of the rewrite time characteristic.

In contrast, suppose the comparison result has shown that the state remains unchanged, for example, keeps in the first state. In this case, it is determined that the memory cell MC has a long rewrite time, that is, the memory cell MC is less apt to transition. This is determined to be binary 1 from a viewpoint of the rewrite time characteristic.

<Physical Quantity: Retention Characteristic>

An explanation will be given, focusing attention on data retention characteristics as the next physical quantity. The retention characteristic means that short or long of a data retention time corresponds to either binary 0 or binary 1 held by the memory cell MC.

That is, suppose a memory cell MC that have not held original data after a specific time holds, for example, binary 0 from a viewpoint of the data retention characteristic, and suppose a memory cell MC that has held original data even when a specific time has elapsed holds, for example, binary 1 from a viewpoint of the data retention characteristic.

More specifically, regardless of whether the resistance is high or low, suppose a memory cell MC that have not held original resistance after a specific time holds, for example, binary 0 from a viewpoint of the data retention characteristic, and suppose a memory cell MC that has held original resistance even when a specific time has elapsed holds binary 1 from a viewpoint of the data retention characteristic.

<Multilevel Data>

Next, a memory cell MC is caused to hold multilevel data by combining the physical quantities. The physical quantities may be combined freely. For example, the magnitude of a resistance is combined with the ease of transition (the length of rewrite time). This is shown in FIG. 21. FIG. 21 is a conceptual diagram showing that a memory cell MC is caused to hold multilevel data by a combination of a resistance and the ease of transition. The vertical represents resistance and the horizontal represents rewrite time.

Suppose a memory cell MC whose resistance is high (see FIG. 20) and whose rewrite time is short holds 00 binary.

Suppose a memory cell MC whose resistance is high (see FIG. 20) and whose rewrite time is long holds 01 binary. In contrast, suppose a memory cell MC whose resistance is low (see FIG. 20) and whose rewrite time is short holds 10 binary. Lastly, suppose a memory cell MC whose resistance is low (see FIG. 20) and whose rewrite time is long holds 11 binary.

Next, a case where a resistance is combined with a retention characteristic will be explained with reference to FIGS. 22A and 22B. FIG. 22A is a conceptual diagram where a memory cell MC is caused to hold multilevel data by a combination of a resistance and the ease of transition. The vertical represents resistance and the horizontal represents retention time. FIG. 22B is another diagram formed on the basis of FIG. 22A.

First, FIG. 22A will be explained. Suppose a memory cell MC whose resistance is high (see FIG. 20) and whose retention time is short holds 00 binary. Suppose a memory cell MC whose resistance is high (see FIG. 20) and whose retention time is long holds 01 binary. In contrast, suppose a memory cell MC whose resistance is low (see FIG. 20) and whose retention time is short holds 10 binary. Finally, suppose a memory cell MC whose resistance is low (see FIG. 20) and whose retention time is long holds 11 binary.

Next, FIG. 22B will be explained. As shown in FIG. 22B, the vertical axis represents resistance (current) and the horizontal axis represents time. To recognize data held in a memory cell MC in a retention time, it is necessary to read the state (high or low resistance) after a specific time since the memory cell MC was caused to transition to, for example, a high-resistance state. Therefore, before reading held data after a specific time, it is necessary to cause the memory cell MC to remain in, for example, the first state by refreshing the memory cell MC a plurality of times. Accordingly, as shown in FIG. 22B, a refresh operation is performed on the memory cell MC constantly or at regular intervals before time t1 is reached. As shown in FIG. 22B, data held by a memory cell MC whose resistance is high (indicated on the vertical axis as High) and which holds the held data even when a specific time has elapsed and time t2 has been reached is determined to be (01) binary. In contrast, data held by a memory cell MC which cannot maintain the held data at time t2 after a specific time has elapsed and whose resistance has decreased (and whose current rises) is determined to be (00) binary. Data held by a memory cell MC whose resistance is low (indicated on the horizontal axis as Low) and which holds the held data even when a specific time has elapsed and time t2 has been reached is determined to be (11) binary. In contrast, data held by a memory cell MC which cannot maintain the held data at time t2 after a specific time has elapsed and whose resistance has decreased (and whose current rises) is determined to be (10) binary.

As described above, the memory cell MC can be caused to hold multilevel data by combining the physical quantities. Of course, the control module 14 recognizes the held data in the memory cell MC.

While multilevel data a memory cell MC can hold using a combination of a resistance and rewrite time or a combination of a resistance and retention time has been explained, combinations are not limited to these. That is, such physical quantities as retention characteristics and rewrite time may be combined.

Another physical quantity is an endurance characteristic. That is, a memory cell MC may be caused to hold multilevel data using combinations of not only such physical characteristics as a resistance and retention time but also endurance characteristics (e.g., the ease of transition from the first state to the second state).

<Control Module 14>

As described above, a memory cell MC of the third embodiment can hold multilevel data using combinations of physical quantities. To manage memory cells MCs characteristic, the control module 14 of the third embodiment recognizes the characteristic of a physical quantity of a memory cell MC on which attention is focused. That is, the control module 14 of the third embodiment recognizes data held by the memory cell MC by a physical quantity on which attention is focused.

With the semiconductor memory device of the third embodiment, it is possible to cause a memory cell MC to hold multilevel data by combining a plurality of physical quantities instead of causing a memory cell MC to hold multilevel data with a physical quantity. When a memory cell MC is written to, read from, or erased from a plurality of times, the memory cell MC deteriorates and the resolution of the held data decreases. That is, adjacent state distributions overlap with one another, contributing to erroneous data reading. Particularly in the case of multilevel cells (MLCs) that have to hold huge amounts of information, the space between adjacent state distributions becomes narrower, and therefore a decrease in the resolution is a primary cause of data corruption.

In contrast, with the semiconductor memory device of the third embodiment, 1-bit data has only to be held with one physical quantity. Therefore, the aforementioned problem can be solved. In addition, even if the memory cell MC has deteriorated, only two state distributions are available, offering the advantage that the memory cell MC can be used for a long time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell having a first physical state and a second physical state, the first physical state and the second physical state being different physical quantities from each other, each of the physical quantities including a first physical quantity and a second physical quantity which differs from the first physical quantity, and the memory cell being capable of holding two-level or more data with a characteristic of the first physical quantity or the second physical quantity; and
    a controller combines the first physical quantity and the second physical quantity, and recognizing data held by the memory cell, the memory cell being capable of holding four-level or more data.

2. The device according to claim 1, wherein each of the first physical state and the second physical state is any one of a resistance of the memory cell, a retention characteristic of the data, rewrite time, and an endurance characteristic of the memory cell.

3. The semiconductor memory device according to claim 1, further comprising:
    first signal lines formed in a first direction;
    second signal lines formed in a second direction perpendicular to the first direction;

a memory cell array having the memory cells formed in a matrix the individuals of which are provided near first areas at the intersections of the first signal lines and the second signal lines and are electrically connected by the first signal lines and the second signal lines; and a signal line driver driving the memory cells via the first and second signal lines, wherein the signal line driver reads the data held by the memory cell and, after a specific time, reads the memory cell again to check whether the memory cell has held the data read when either the first physical state or the second physical state is a retention characteristic of the memory cell.

4. The semiconductor memory device according to claim 3, further comprising:

first signal lines formed in a first direction;

second signal lines formed in a second direction perpendicular to the first direction;

a memory cell array having the memory cells formed in a matrix the individuals of which are provided near first areas at the intersections of the first signal lines and the second signal lines and are electrically connected by the first signal lines and the second signal lines; and a signal line driver driving the memory cells via the first and second signal lines, wherein the signal line driver causes the memory cell to hold either two levels or four levels as the data by controlling the voltage applied to the memory cell and/or the length of transfer time of the voltage.

* * * * *